(12) United States Patent
Hara

(10) Patent No.: US 8,724,425 B2
(45) Date of Patent: May 13, 2014

(54) SEMICONDUCTOR STORAGE DEVICE AND MEMORY SYSTEM

(75) Inventor: Kota Hara, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/398,495

(22) Filed: Feb. 16, 2012

(65) Prior Publication Data

US 2012/0147691 A1 Jun. 14, 2012

Related U.S. Application Data

(62) Division of application No. 12/412,092, filed on Mar. 26, 2009, now Pat. No. 8,139,438.

(30) Foreign Application Priority Data

Mar. 31, 2008 (JP) .................................. 2008-92009

(51) Int. Cl.
*G11C 8/00* (2006.01)
(52) U.S. Cl.
USPC .................................................. 365/230.08
(58) Field of Classification Search
None
See application file for complete search history.

(56) References Cited

U.S. PATENT DOCUMENTS

| 4,159,541 | A | | 6/1979 | Lauffer et al. |
| 4,695,980 | A | * | 9/1987 | Fukuzo et al. ........... 365/189.12 |
| 4,916,668 | A | * | 4/1990 | Matsui ...................... 365/230.01 |
| 5,404,327 | A | * | 4/1995 | Houston ....................... 365/203 |
| 6,661,698 | B1 | | 12/2003 | Kang |
| 6,925,016 | B2 | | 8/2005 | Takahashi et al. |
| 7,145,812 | B2 | | 12/2006 | Takahashi et al. |
| 2007/0297259 | A1 | | 12/2007 | Miyamoto |
| 2008/0007303 | A1 | | 1/2008 | Watanabe et al. |

FOREIGN PATENT DOCUMENTS

| JP | 54-014130 | | 2/1979 |
| JP | 07-321618 | A | 12/1995 |
| JP | 11-273380 | A | 10/1999 |
| JP | 2002-304883 | A | 10/2002 |
| JP | 2008-021340 | A | 1/2008 |

OTHER PUBLICATIONS

Office Action from JP Application No. 2008-092009, Jul. 10, 2012.

\* cited by examiner

*Primary Examiner* — Huan Hoang
*Assistant Examiner* — James G Norman
(74) *Attorney, Agent, or Firm* — Arent Fox LLP

(57) ABSTRACT

A semiconductor storage device includes an external terminal to which a first signal is supplied, a core circuit, and an access operation control circuit that generates a signal indicating an access operation mode to the core circuit for subsequent cycles based on a pulse width of the first signal.

4 Claims, 27 Drawing Sheets

SEMICONDUCTOR STORAGE DEVICE AND MEMORY SYSTEM

CROSS-REFERENCE TO RELATED APPLICATION

This Application is a Divisional of U.S. patent application Ser. No. 12/412,092, filed Mar. 26, 2009, which claims priority of Japanese Patent Application No. 2008-92009, filed Mar. 31, 2008. The disclosures of the prior applications are incorporated herein by reference in entirety.

BACKGROUND

1. Field

Aspects of the embodiments discussed herein are directed to a semiconductor storage device having a plurality of access modes.

2. Description of the Related Art

With as increase in an operating frequency of a controller that controls a semiconductor storage device, a demand for improvement in data transfer rate (band width) of the semiconductor storage device increases. With an increase in the storage capacity of the semiconductor storage device, various data have begun to be held in the semiconductor storage device. An access speed and a storage capacity often vary depending on the type of data. Japanese Laid-open Patent Publication No. 2002-304883, Japanese Laid-open Patent Publication No. H11-273380 or the like describe semiconductor memories that switch an access mode during a normal operation.

SUMMARY

According to aspects of embodiments described herein, a semiconductor storage device is provided which includes an external terminal to which a first signal is supplied and an access operation control circuit that generates a signal indicating an access operation mode to a core circuit for subsequent cycles eased or a pulse width of the first signal.

Additional advantages and novel, features of the invention will be set forth in part in the description that follows, and in part will become more apparent to those skilled in the art upon examination of the following or upon learning by practice of the invention.

DESCRIPTION OF EMBODIMENTS

In the Figures, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol suffixed with a letter "Z" indicated a positive logic. A signal having a reference symbol prefixed with a symbol "/" and a signal having a reference symbol suffixed with a letter "X" indicate a negative logic. A double-square symbol represents an external terminal such as a pad on a semiconductor chip or a lead of a package containing the -semiconductor chip therein. Terminals and signals supplied through the terminals, respectively, are denoted by like reference symbols.

Figure 1:
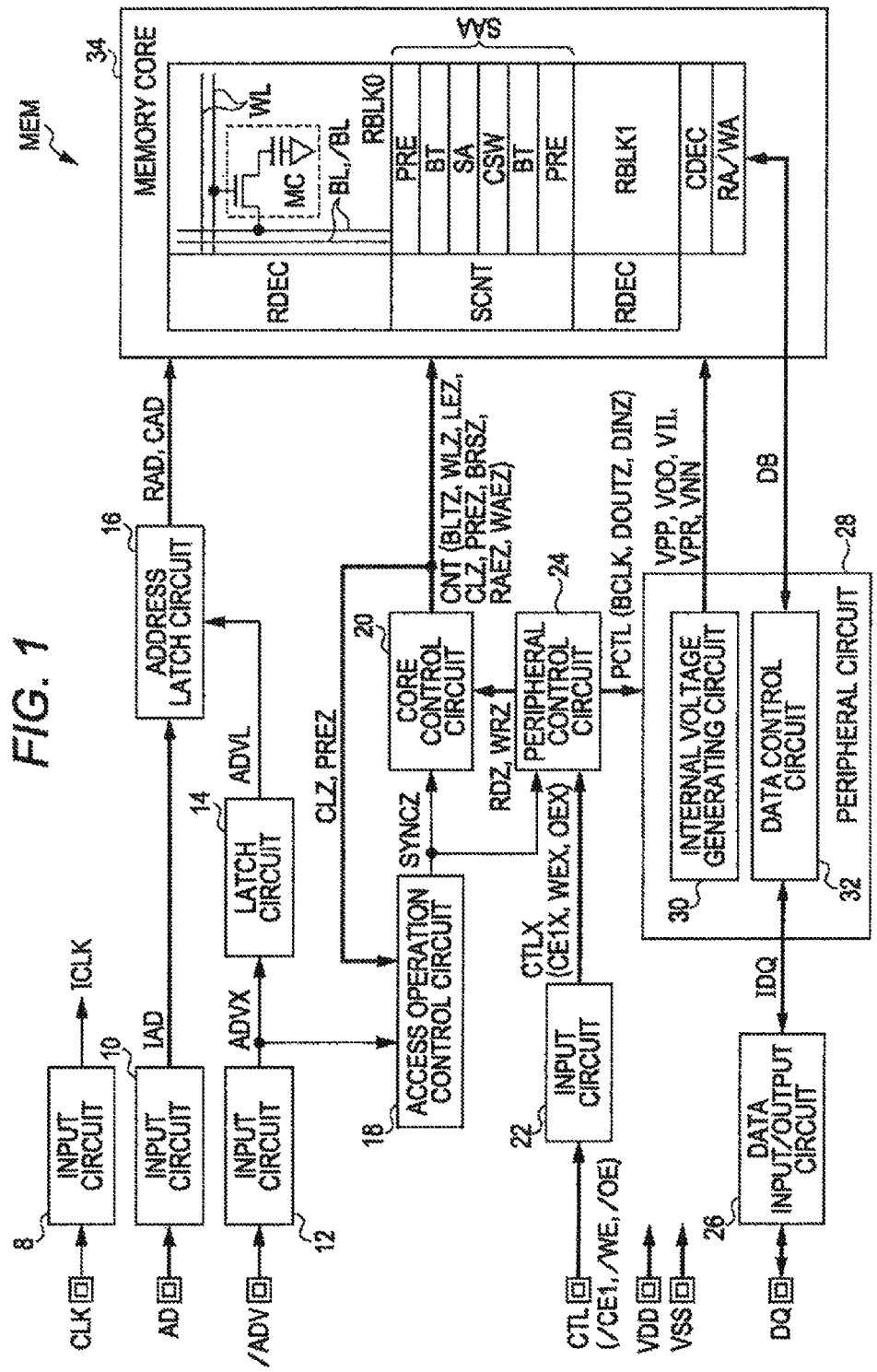
FIG. 1 illustrates a first embodiment.

FIG. 1 illustrates a first embodiment. A semiconductor memory MEM according to aspects of the first embodiment may be, for example, a pseudo SRAM type Fast Cycle RAM (FCRAM). A pseudo SRAM includes DRAM dynamic memory cells and ah SRAM interface. The memory MEM may be a semiconductor storage device enclosed in a package. The memory MEM may be a memory macro (IP) mounted on a system LSI, etc. The memory MEM according to aspects of the first embodiment operates in synchronization with a clock CLK (synchronous operating mode) or asynchronously to the clock CLK (asynchronous operating mode).

The memory MEM included input circuits 8, 10, and 12, a latch circuit 14, an address latch circuit 16, an access operation control circuit 18, a core control circuit 20, an input circuit 22, a peripheral control circuit 24, a data input/output circuit 26, a peripheral circuit 28, and a memory core 34. The peripheral circuit 28 includes an Internal voltage generating circuit 30 and a data control circuit 32.

The input circuit 8 receives a clock signal CLK and outputs an internal clock signal ICLK. The input circuit 10 receives an address signal AD and outputs an internal address signal IAD. The semiconductor memory MEM contemporaneously receives a row address signal RAD and a column address signal CAD at different terminals AD (address non-multiplex type).

The input circuit 12 receives an address valid signal /ADV and outputs an address valid signal ADVX. A change in an address signal AD is detected in the memory MEM based on the address valid signal /ADV. The address valid signal /ADV indicates a defined period of time of the address signal AD. An access operation to the memory MEM is performed based on the address valid signal /ADV. To supply a proper address signal AD to the memory MEM, a controller, which accesses the memory, MEM, holds a logic level of ode address signal AD for a certain period of time after a falling edge of the address valid signal /ADV.

The latch circuit 14 latches the address valid signal ADVX and outputs the latched signal as a latch address valid signal ADVL. The address latch circuit 16 latches the internal address signal IAD in synchronization with the latch address valid signal ADVL and outputs the internal address signal IAD as a row address signal RAD and a column address signal CAD.

The access operation control circuit 18 compares timing of a rising edge of the address valid signal ADVX with timing of a rising edge of a column control signal CLZ and sets a logic level of a synchronous mode signal SYNCZ according to a result of the comparison.

The core control circuit 20 outputs control signals CNT that control an access operation to the memory core 34, for example, a read operation or a write operation, in response to a read control signal RDZ and a write control signal WRZ from the peripheral control circuit 24. The control signals CNT include at least one of a bit control signal BLTZ, a word control signal WLR, a sense amplifier control signal LEZ, a column control signal CLZ, a precharge control signal PREZ, a hit reset signal BRSZ, a read amplifier control signal RAEZ, and a write amplifier control signal WAEZ. By the bit control signal BLTZ, a connection switch BT is controlled. The word control signal WLZ activates a word line WL. The sense amplifier control signal LEZ activates a sense amplifier SA. The column control signal CLE turns on a column switch CSW. By the precharge control signal PREZ, precharging of bit lines BL and /BL starts. The precharge control signal PREZ indicates the end of an access operation. The bit reset signal BRSZ indicates a period of time during which bit lines BL and /BL are precharged. The read amplifier control signal activates a read amplifier RA. The write amplifier control signal WAEZ activates a write amplifier WA.

Though now shown, the core control circuit 20 includes a refresh request generating circuit, a refresh address counter, and an arbiter. The refresh request generating circuit periodically generates an internal refresh command to perform a refresh operation. The refresh address counter sequentially generates a refresh address signal in synchronization with the internal refresh command. The arbiter determines priorities of an access operation and a refresh operation when an external access command, for example, a read control signal RDZ or a write control signal WRZ, competes with an internal refresh command.

The column control signal CLZ is output upon a read operation and a write operation and is not output upon a refresh operation. The read amplifier control signal RAEZ is output upon a read operation. The write amplifier control signal WAEZ is output upon a write operation. Other control signals BLTZ, WLZ, LEZ, and PREZ are output upon a read operation, a write operation, and a refresh operation.

The input circuit 22 receives control signals CTL and outputs internal control signals CTLX. The control signals CTL include, for example, a coin enable signal /CE1, a write enable signal /WE, or an output enable signal /OE. The internal control signals CTLX include, for example, a chip enable signal CE1X, a write enable signal WEX, or an output enable signal OEX. The logic levels of the signals CE1X, WEX, and OEX are substantially equal to the logic levels of the signals /CE1, /WE, and /OE. The control signals CTL are command signals for performing an access operation, for example, a read operation or a write operation, to the memory core 34. The memory MEM may include an input circuit that receives an upper byte control signal /UB and a lower byte control signal /LB that indicate whether data signals DQ, are valid or invalid. For example, when data terminals DQ are of 16 bits (2 bytes), an upper byte control signal /UB is activated to a low level when an upper one byte of data signals DQ is input or output. A lower byte control signal /LB is activated to a low level when a lower one byte of the data signals DQ is input or output.

The peripheral control circuit 24 outputs a read control signal RDZ, a write control signal WRZ and peripheral control signals PCTL, according to the internal control signals CTLX, for example, CE1X, WEX, and OEX. The peripheral control signals PCTL include, for example, a burst clock signal BCLK, a data output control signal DOUTZ, or a data input control signal DINZ. The peripheral control circuit 24 outputs the signals RDZ, WRZ, AND PCTL to perform an access operation to the memory core 34 in an asynchronous mode from a next operation cycle where the synchronous mode signal SYNCZ changes to a low level. The peripheral control circuit 24 outputs the signals RDZ, WRZ, and PCTL to perform, an access operation to the memory core 34 in a synchronous mode from a next operation cycle where the synchronous mode signal SYNCZ changes to a high level. The synchronous mode signal SYNCZ instructs an access operation.

The data input/output circuit 26 receives, upon a read operation, read data to be supplied from the data control circuit 32, through an internal data line IDQ end outputs the received read data to data terminals DQ, for example, 16-bit terminals. The data input/output circuit 26 receives, upon a write operation, a write data signal to be supplied to the data terminals DQ and supplies the received data signal to the data control circuit 32 through the internal data line IDQ.

The internal voltage generating circuit 30 receives a power supply voltage VDD, for example, 1.8 V and generates internal power supply voltages VPP, VOO, VII, VPR, and VNN. The internal power supply voltages VPP, VOO, VII, VPR, and VNN may be constant voltages that do not depend on fluctuations in the power supply voltage VDD.

The voltage VPP, for example, a boost voltage of 2.8 V, may foe a high-level voltage for a word line WL and a high-level voltage for turning on a connection switch BT upon an access operation. The voltage VOO, for example, 2.2 V is a high-level voltage for turning on a connection switch BT during a standby period where an access operation is not performed.

The voltage VII, for example, 1.6 V is supplied to internal circuits as an internal power supply voltage. The internal circuits include, for example, the latch circuit 14, the address latch circuit 16, the access operation control circuit 18, the core control circuit 30, the peripheral control circuit 24, the data control circuit 32 and the memory core 34. The voltage VPR, for example, 0.8 V may be a precharge voltage for bit lines BL and /BL. The voltage VNN, for example, a negative voltage −0.4 V, may be a low-level voltage for a word line WL.

The data control circuit 32 receives, upon a read operation, read data to be read from the memory core 34, through a data bus DB and outputs the received read data to the internal data line IDQ. The data control circuit 32 receives, upon a write operation, a write data signal to be supplied to the internal data line IDQ and supplies the received data signal to the memory core 34 through the data bus DB. For example, during a synchronous operating mode, the data control circuit 32 inputs/outputs data in synchronization with the burst elect signal BCLK. The number of pulses of the burst clock signal BCLK is determined according to a burst length set in, for example, a mode register or a configuration register (not illustrated). For example, during an asynchronous operating mode, the data control circuit 32 outputs read data from the memory core 34 to the internal data line IDQ in synchronization with the data output, control signal DOUTZ and outputs write data from the data terminals DQ, to the data bus DB in synchronization with the data input control signal DINZ.

The bit width of the data bus DB is, for example, an integral multiple, e.g., twice, four times or eight times or the bit width of the internal data line IDQ. The data control circuit 32 converts, upon a read operation, read data to be read in parallel from the memory core 34 to serial data according to lower bits of a column address signal CAD. The data control circuit 32 converts, upon a write operation, write data to be transferred serially from the data terminals DQ to parallel data according to lower hits of a column address signal CAD.

The memory core 34 includes a plurality of memory blocks RBLK, for example, RBLK0 to PBLK1, row decoders RDEC for the respective memory blocks RBLK, a sense amplifier areas SAA disposed between the memory blocks RBLK, a sense amplifier control units SCNT disposed between the row decoders RDEC, a column decoder CDEC, a read amplifier RA, and a write amplifier WA. The number of memory blocks RBLK may be 2 to the n-th power where n is an integer greater than or equal to 2, for example, 4, 8, or 16.

Each of the memory blocks RBLK0 to PBLK1 includes a plurality of dynamic memory cells MCs disposed in a matrix form; a plurality of word lines WL coupled to strings of the memory cells MCs arranged in a horizontal direction in the drawing; and a plurality of bit lines BL and /BL coupled to strings of the memory cells MCs arranged in a vertical direction in the drawing. Each memory cell MC includes a capacitor that holds data as a charge; and a transfer transistor that coupled one end of the capacitor to a bit line BL or /BL. The other end of the capacitor is coupled to a reference voltage line. A reference voltage to be supplied to the reference voltage line may be substantially the same as a precharge voltage VPR, for example, and is generated by the internal voltage generating circuit 30.

The sense amplifier area SAA includes precharge circuits PRE and connection switches BT for corresponding one of the memory blocks RBLK0 to PBLK1; and a sense amplifiers SA and a column switches CSW, which are shared between the memory blocks RBLK0 to PBLK1. The sense amplifier control unit SCNT generates core control signals that control the operations of the precharge circuits PRE, the connection switches BT, the sense amplifier SA, and the column switch CSW, in response no control signers CNT.

Each row decoder RDEC decodes a row address signal RAD to select one of word lines WL. The column decoder CDEC decodes a column address signal CAD to select bit-line pairs BP and /BL whose no oh or corresponds to the number of bits of the data terminals DQ or an integral multiple of the number. The read amplifier to amplifies, upon a read operation, complementary read data to be output through a column switch CSW. The write amplifier WA amplifies, upon a write operation, complementary write data to be supplied through the data bus DB and supplies the amplified data to a bit-line pair BL and /BL.

Figure 2:
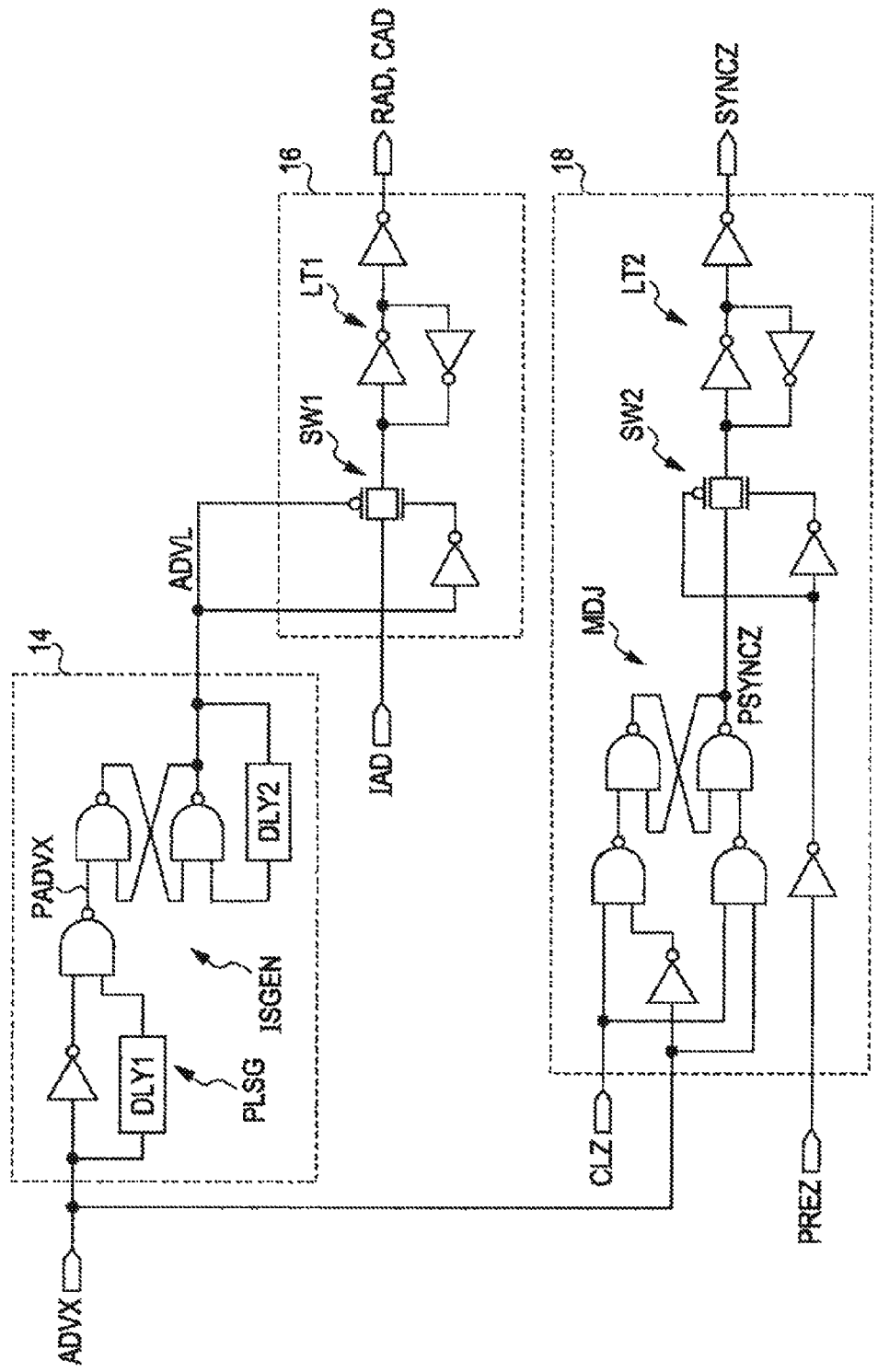
FIG. 2 illustrates an exemplary latch circuit, an exemplary address latch circuit, and an exemplary access operation control circuit.

FIG. 2 illustrates an exemplary latch circuit, an exemplary address latch circuit, and an exemplary access operation control circuit. The exemplary latch circuit, the exemplary address latch circuit and the exemplary access operation control circuit may be the latch circuit 14, the address latch circuit 16 and the access operation control circuit 18 illustrated in FIG. 1 respectively. The address latch circuit 16 is provided for each bit of an address signal AD.

The latch circuit 14 includes a pulse generating unit PLSG and an internal signal generating unit ISGEN. The purse generating unit PLSG generates a pulse signal PADVX having a pulse width corresponding to a delay time of a delay circuit DLY1 in synchronization with a falling edge of an address valid signal ADVX. The internal signal generating unit ISGEN generates a latch address valid signal ADVL having an activation period corresponding to a delay time of a delay circuit DLY2, e.g., a low-level period, in synchronization with the pulse signal PADVX. The latch circuit 14 latches an address valid signal ADVX and generates a latch address valid signal ADVL having a substantially constant pulse width DLY2 regardless of the activation, period, of the address valid signal ADVX (=/ADV).

The address latch circuit 16 includes a switch SW1 and a latch LT1. The switch SW1 includes, for example, a CMOS transfer gate and supplies an internal address signal IAD to the latch LT1 while the latch address valid signal APVL is at a low level. The latch LT1 latches the internal address signal IAD and outputs the internal address signal IAD as a row address signal RAD and a column address signal CAD.

The access operation control circuit 18 includes a mode determining unit MDJ, a switch SW2, and a latch LT2. The mode determining unit MDJ sets a synchronous mode signal PSYNCZ to a low level when the address valid signal ADVX is at a low level during a high-level period of a column control signal CLZ. The mode determining unit MDJ sets the synchronous mode signal to a high level when the address valid signal ADVX is at a high level during a high-level period of the column control signal CLZ. The switch SW2 includes, for example, a CMOS transfer gate and supplies a level of the synchronous mode signal PSYNCZ to the latch LT2 while a precharge control signal PREZ is at a high level. The latch LT2 latches the level or the synchronous mode signal PSYNCZ and outputs the level of the synchronous mode signal PSYNCZ as a synchronous mode signal SYNCZ.

Figure 3:
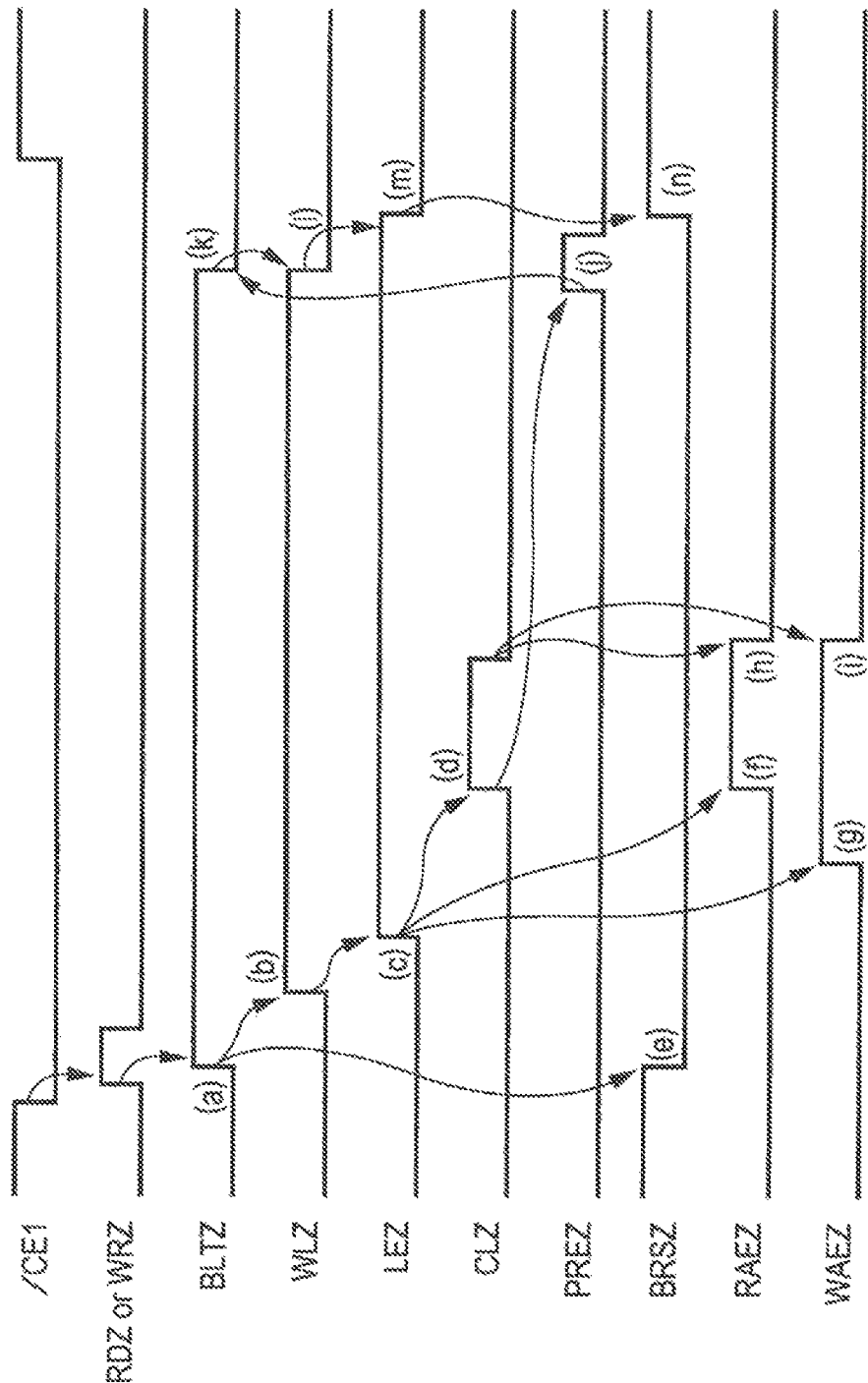
FIG. 3 illustrates an exemplary core control circuit.

FIG. 3 illustrates an exemplary operation of the core control circuit 20 shown in FIG. 1. When a chip enable signal /CE1 is activated to a low level and a read control signal RDZ or a write control signal WRZ is output from the peripheral control circuit 24, the core control circuit 20 sequentially activates a bit control signal BLTZ, a word control signal WLZ, a sense amplifier control signal LEZ, and a column control signal CLZ ((a), (b), (c), and (d) of FIG. 3). The core control circuit 20 activates a bit reset signal BRSZ in synchronization with the activation of the bit control signal BLTZ ((e) of FIG. 3).

In a read operation, the core control circuit 20 activates a read amplifier control signal RAEZ in synchronization with, for example, the activation of the sense amplifier control signal LEZ ((f) of FIG. 3). In a write operation, the core control circuit 20 activates a write amplifier central signal WAEZ in synchronization with, for example, the activation of the sense amplifier control signal LEZ ((g) of FIG. 3). The read amplifier control signal RAEZ and the write amplifier control signal WAEZ are deactivated in synchronization with, for example, deactivation of the column control signal CLZ ((h) and (i) of FIG. 3).

The core control circuit 26 temporarily activates a precharge control signal PREZ after a lapse of a certain period of time from the activation of the column control signal CLZ ((j) of FIG. 3). The hit control signal BLTZ, the word control signal WLZ, and the sense amplifier control signal LEZ are sequentially deactivated in synchronization with the activation of the precharge control signal PREZ, ((k), (l), and (m) of FIG. 3). The hit reset signal BRSZ is activated, whereby the read operation or write operation ends ((n) of FIG. 3).

In a synchronous operating mode, for example, a column control signal CLZ having a plurality of pulses is output. A precharge control signal PREZ is activated in synchronization with the last pulse of the column control signal CLZ. A read amplifier control signal RAEZ and a write amplifier control signal WAEZ are deactivated in synchronization with the last pulse of the column control signal CLZ.

Figure 4:
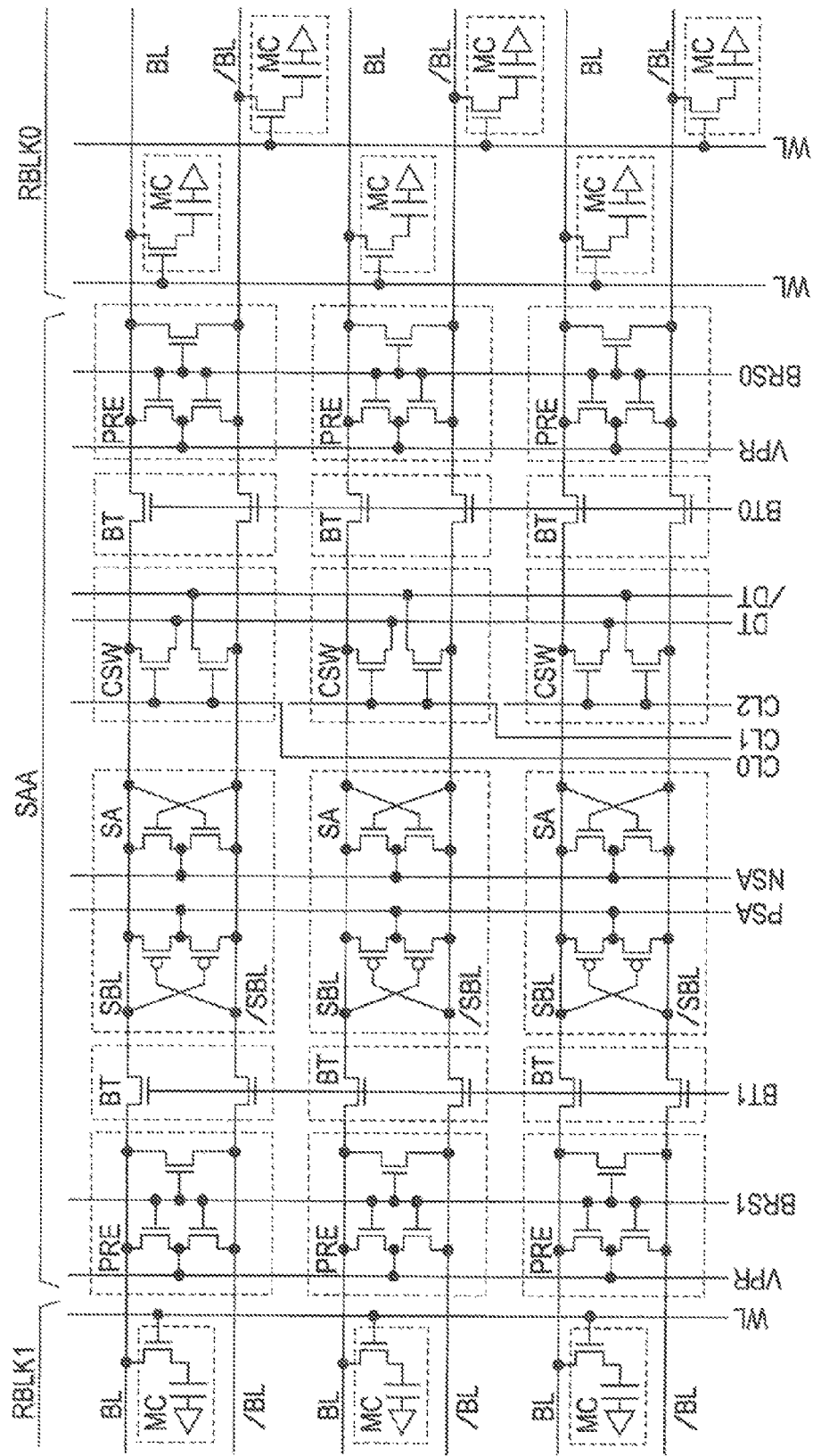
FIG. 4 illustrates an exemplary sense amplifier area.

FIG. 4 illustrates an exemplary sense amplifier area. The exemplary sense amplifier area may be the sense amplifier area SAA illustrated in FIG. 1. FIG. 4 illustrates, for example, part of a sense amplifier area SAA corresponding to one data terminal DQ in FIG. 1. When the memory MEM has 16-bit data terminals DQ, the sense amplifier area SAA in FIG. 4 is formed for each data terminal DQ. The sense amplifier area SAA includes precharge circuits PRE and connection switches BT for corresponding one of the memory blocks RBLK0 to PBLK1; and sense amplifiers SA and column switches CSW which are shared between the memory blocks RBLK0 to PBLK1.

Precharge control signals BRS, tor example, BRS0 and BRS1, that control the precharge circuits PRE change to a low level in synchronization with deactivation of a bit reset signal BRSZ, and change co a high level in synchronization with activation of the bit reset signal BRSZ. In a memory block PBLK that is not accessed, a high-level precharge control signal BRS is supplied to corresponding precharge circuits PRE.

Each connection switch BT selectively connects a bit-line pair BL and /BL of one of the memory blocks RBLK0 to PBLK1 to bit lines SBL and /SBL of one of the sense amplifiers SA. The connection switch BT corresponding to a memory bock RBLK to be accessed receives a bit control signal BT, for example, BT0 or BT1, that changes to a high level during a high-level period of a bit control signal BLTZ.

Each column switch CSW is turned on when, a corresponding column selection, signal CL, for example, CL0, CL1, or CL2, is at a high level, and couples a corresponding sense amplifier SA and a corresponding bit-line pair BL and /BL to data lines DT and /DT. The column selection signals CL0 to CL2 are generated during a high-level period of a column, control signal CLZ. For example, data lines DT and /DT are wired for each pair of memory blocks RBLK0 and RBLK1 and are wired for each bit of the data terminals DQ in a shared manner. Sense amplifier activation signals PSA and NSA that control the sense amplifiers SA respectively change to a high level and a low level during a high-level period of a sense amplifier control signal LEZ.

In each of the memory clocks RBLK0 to PBLK1, each memory cell MC is coupled to a word line WL and a bit line BL or /BL. A word line WL to be selected by a row address signal RAD changes to a high level during a high-level period of a word control signal WLZ. The sense amplifier area SAA may have the same or similar configuration to DRAM sense amplifiers.

Figure 5:
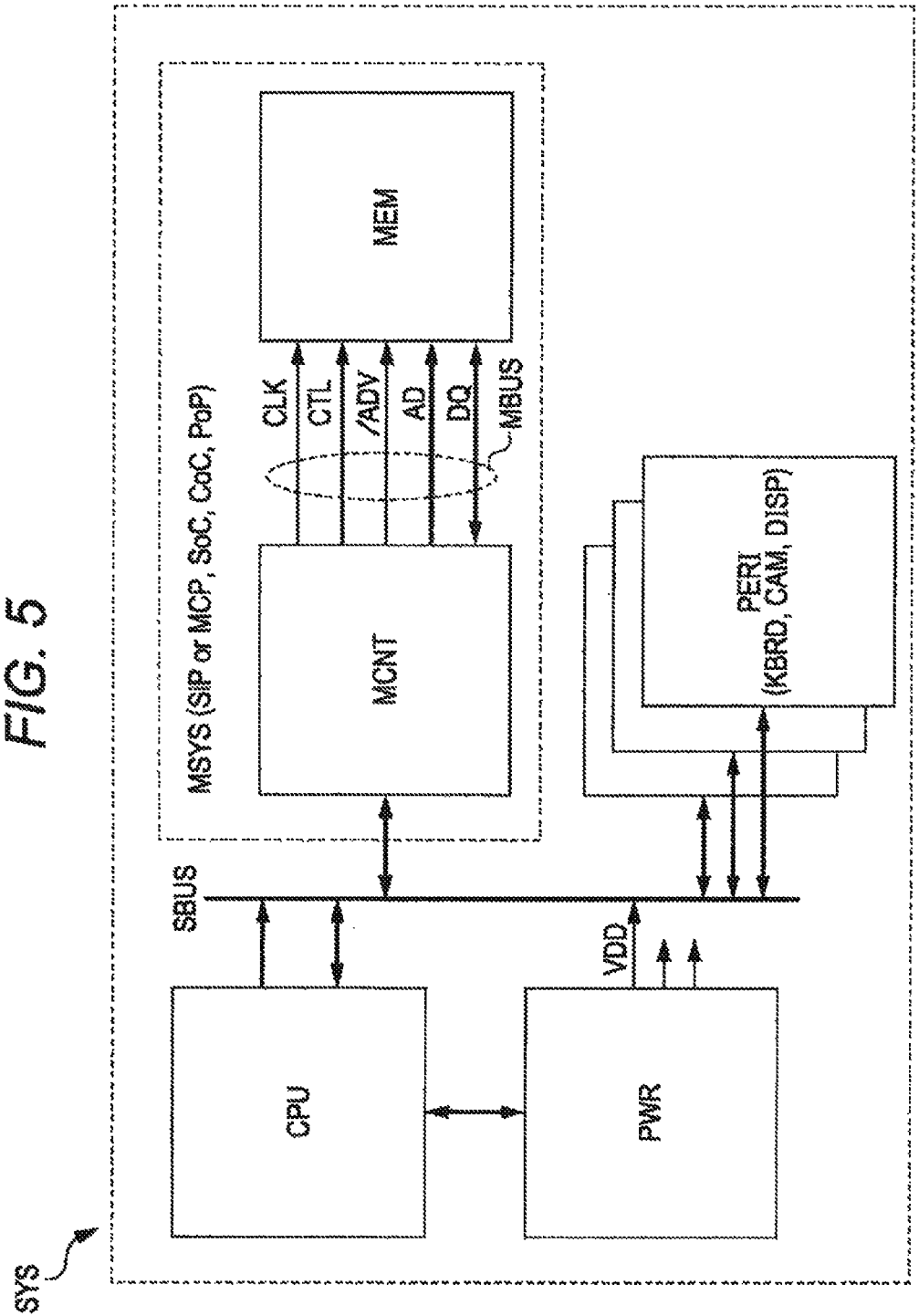
FIG. 5 illustrates an exemplary systems on which a memory is mounted.

FIG. 5 illustrates an exemplary system. The memory MEM illustrated in FIG. 1 may be mounted on the system SYS. The system, SYS is, for example, a portable device such as a mobile phone. Aspects which will be described later may be applied to the system illustrated in FIG. 5.

The system SYS includes the memory MEM illustrated in FIG. 1; a memory controller MCNT that accesses the memory MEM; a plurality of peripheral devices PERI; a power supply controller PWR; and a CPU that controls the entire system SYS. The CPU, the memory controller MCNT, the peripheral devices PERI, and the power supply controller PWR are coupled to each other by a system bus SBUS. The peripheral devices PERI include, tor example, an input device KBRD such as a keyboard, a camera CAM such as a CCD, and a display device DSIP such as a liquid crystal display panel. The power supply controller PWR receives an external power supply and generates, for example, a power supply voltage VDD and a power supply voltage to be used for the display device DSIP, etc.

A memory system MSYS includes, for example, the memory MEM and the memory controller MCNT. The memory system MSYS includes a system-in-package SiP in which a plurality of chips are mounted on a package substrate such as a lead frame. The memory system MSYS includes a multi-chip package MCP in which a plurality of chips are stacked each other on a package substrate. The system BBS includes a system-on-chip (SoC) in which a plurality of macros are integrated on a silicon substrate. The system SYS may be a chip-on-chip (CoC) or a package-on-package (PoP).

The CPU may be a bus master and controls the memory MEM and the peripheral devices PERI. For example, to perform a read operation from the memory MEM, the CPU outputs a command signal and an address signal to the system bus SBUS and receives a read data signal from the memory MEM. To perform a write operation to the memory MEM, the CPU outputs a command signal, an address signal, and a write data signal to the system bus SBUS.

The memory controller MCNT outputs control signals CTL, an address valid signal /ADV, an address signal AD, and a write data signal DQ to the memory MEM, based on the command signal, the address signal, and the write data signal from the CPU, and receives a read data signal DQ from the memory MEM. When the memory controller MCNT accesses the memory MEM in a synchronous operating mode, the memory controller MCNT supplies a clock signal CLK to the memory MEM. The clock signal CLK may also be supplied to the memory MEM during an asynchronous operating mode. The clock signal CLK is generated by, for example, an oscillator in the system SYS. The clock signal CLK may be generated by frequency-dividing, in the memory controller MCNT, the frequency of a clock signal generated by the oscillator. The memory MEM is coupled to the memory controller MCNT through a memory bus MBUS.

The memory controller MCNT may be provided in the CPU and control signals CTL, an address valid signal /ADV, an address signal AD, and a data signal DQ, which are used to perform a read operation from and a write operation to the memory MEM, may be output to the memory MEM from the CPU.

Figure 6:
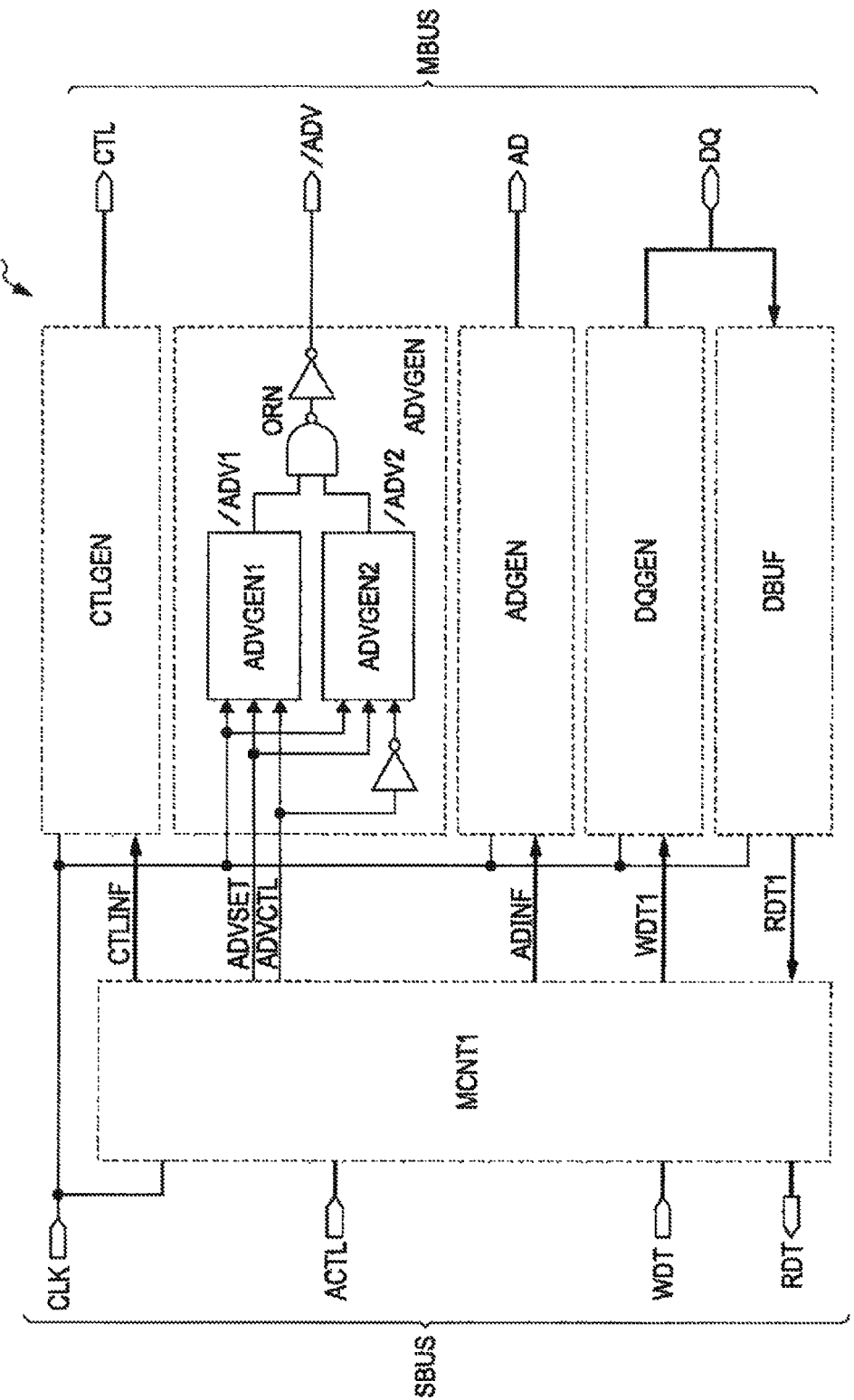
FIG. 6 illustrates an exemplary memory controller.

FIG. 6 illustrates an exemplary memory controller. The exemplary memory controller may be the memory controller MCNT illustrated in FIG. 5. The memory controller MCNT includes a main control unit MCNT1, signal generating circuits CTLGEN, ADVGEN, ADGEN, and DQGEN, and a data input buffer DBUF.

The main, control unit MCNT1 receives en access control signal ACTL and a writs data signal WDT which are supplied from the CPU through a system has SBUS. For example, the access control signal ACTL includes information on an access regress such as a write request or a read request, an access start address, the number of data transferred, and an access mode such as a synchronous operating mode or an asynchronous operating mode. The main control unit MCNT1 outputs control information CTLINF, an address valid sec signal ADVSET, an address valid control signal ADVCTL, address information ADINF, and write data WDT1 to the signal generating circuits CTLGEN, ADVGEN, ADGEN, and DQGEN, according to the access control signal ACTL from the CPU. The main control unit MCNT1 receives read data RDT1 from she data input buffer DBUF and outputs the read data RDT1 to the system bus SBUS as read data RDT.

Figure 7:
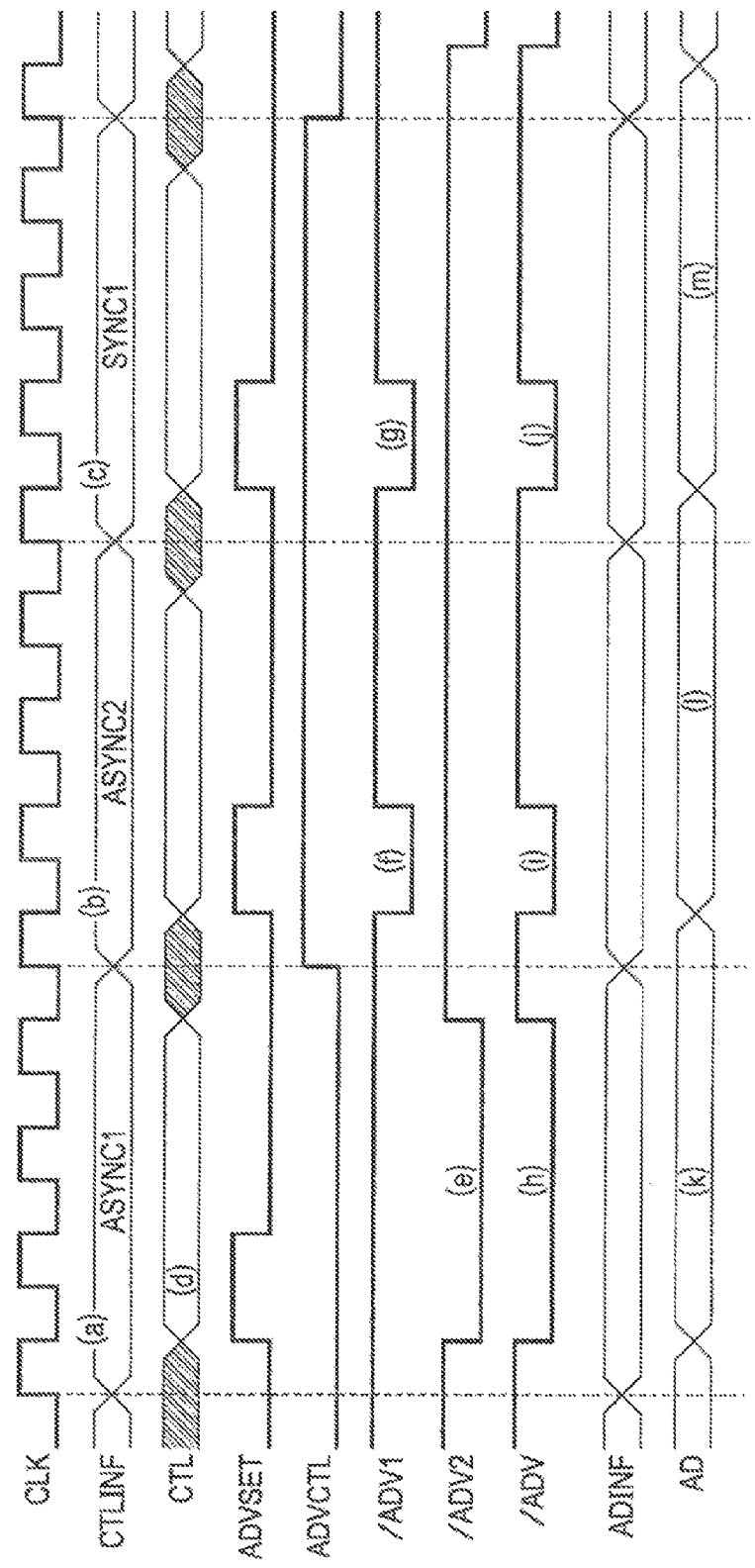
FIG. 7 illustrates an exemplary operation of a memory controller.

The signal generating circuit CTLGEN receives the control information CTLINF and outputs control signals CTL to the memory MEM through a memory bus MBUS in synchronization with a clock signal CLK. The signal generating circuit ADVGEN includes a first signal generating unit ADVGEN1, a second signal generating unit ADVGEN2, and a negative-logic OR circuit ORN. The first signal generating unit ADVGEN1 activates a first pulse signal /ADV1 in synchronization with the address valid set signal ADVSET when the address valid control signal ADVCTL is at a high level. The second signal generating unit ADVGEN2 activates a second pulse signal /ADV2 in synchronization with the address valid sat signal ADVSET when the address valid control signal ADVCTL is at a low level. As illustrated in FIG. 7, an activation period, for example, a low-level period, of the first pulse signal /ADV1 is shorter than an activation period, for example, a low-level period, of the second pulse signal /ADV2. The first pulse signal /ADV1 and the second pulse signal /ADV2 may have different pulse widths.

The signal generating circuit ADGEN receives the address information ADINF and outputs an address signal AD to the memory MEM through the memory bus MBUS in synchronization, with the clock signal CLK. The signal generating circuit DQGEN receives the write data WDT1 and outputs write data DQ to the memory MEM through the memory bus MBUS in synchronization with the clock signal CLK. The data input buffer DBUF receives read data DQ from the memory MEM and outputs the read data DQ to the main control unit MCNT1 as read data RDT1.

FIG. 7 illustrates an exemplary operation of the memory controller MCNT illustrated in FIG. 6. In FIG. 7, the main control unit MCNT1 Sequentially generates, based on an access request from the CPU, control information CTLINF for performing an asynchronous access operation ASYNC1, an asynchronous access operation ASYNC2, and a synchronous access operation SYNC1 ((a), (b), and (c) of FIG. 7). Each access operation has a four clock cycle. Each access operation may be performed using other numbers of cycles toss a four clock cycle. The number of clock cycles may be changed every access operation.

The signal generating circuit CTLGEN generates a control signal CTL according to the control information CTLINF and outputs the control signal CTL to the memory MEM ((d) of FIG. 7). The signal generating circuit ADGEN inverts an address valid set signal ADVSET when an address valid control signal ADVCTL is at a low level, and generates a second pulse signal /ADV2 in which a trailing edge of the address valid set signal ADVSET is delayed ((e) of FIG. 7). The signal generating circuit ADGEN inverts the address valid set signal ADVSET when the address valid control signal ADVCTL is at a high level, and generates a first pulse signal /ADV1 ((f) and (g) of FIG. 7).

The OR circuit ORN of the signal generating circuit ADGEN outputs the second pulse signal /ADV2 or the first pulse signal /ADV1 as an address valid signal /ADV ((h), (i), and (j) of FIG. 7). The signal generating circuit ADGEN generates an address signal Ah according to address information ADINF and outputs the address signal AD to the memory MEM ((k), (l), and (m) of FIG. 7). Though not shown, in a write operation, the signal generating circuit DQGEN outputs write data DQ to the memory MEM. In a read operation, the data input buffer DBUF receives read data DQ from the memory MEM.

Figure 8:
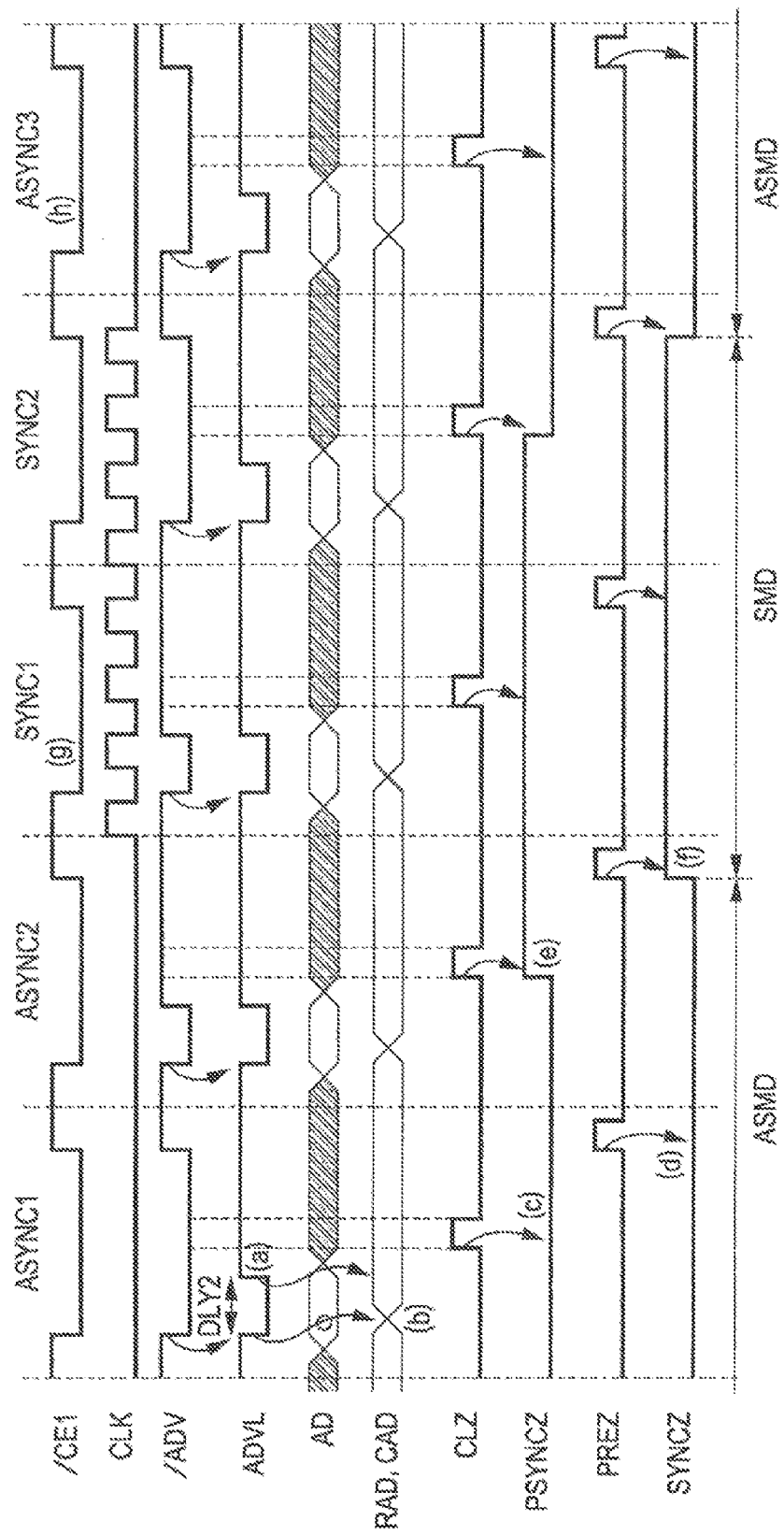
FIG. 8 illustrates an exemplary access operation to a memory.

FIG. 8 illustrates an exemplary access operation to the memory MEM illustrated in FIG. 1. In FIG. 8, an asynchronous access operation ASYNC1, an asynchronous access operation ASYNC2, a synchronous access operation SYNC1, a synchronous access operation SYNC2, and an asynchronous access operation ASYNC3 are sequentially performed. In an asynchronous access operation, the memory MEM receives input signals CTL, AD, and DQ asynchronously to a clock signal CLK and outputs an output signal DQ asynchronously to the clock signal CLK. In a synchronous access operation, the memory MEM receives input signals CTL, AD, and DQ in synchronization with the clock signal CLE and outputs an output signal DQ in synchronization with the clock signal CLK. The synchronous access operations SYNC1 and SYNC2 in FIG. 8 are performed in a four clock cycle, for example. Each of the synchronous access: operations SYNC1 and SYNC2 may be performed using other numbers of cycles than a four clock cycle. The number of clock cycles may be changed every access operation, according to a burst length, etc.

The latch circuit 14 illustrated in FIG. 2 outputs a latch address valid signal ADVL having a substantially constant pulse width regardless of the pulse width, for example, a low-level period, of an address valid signal /ADV to be supplied to an external terminal /ADV ((a) of FIG. 8). The latch circuit 14 may detect a falling edge of the address valid signal /ADV to generate the latch address valid signal ADVL. An address signal ADN is received based on the latch, address valid signal ADVL. Even when the pulse width of the address valid signal /ADV is changed every access operation, the memory MEM operates normally. The low-level period of the latch address valid signal ADVL may be substantially equal to a delay time of the delay circuit DLY2 illustrated, in FIG. 2.

The address latch circuit 16 illustrated in FIG. 2 receives an address signal AD during a low-level period of the latch address valid signal ADVL. The address latch, circuit 16 stops receiving the address signal AD in synchronization with a rising edge of the latch address valid signal ADVL and latches the address signal AD ((b) of FIG. 8).

The access operation control circuit 18 illustrated in FIG. 2 sets a synchronous mode signal PSYNCZ to a low level when the address valid signal /ADV is at a low level during activation of a column control signal CLZ ((c) of FIG. 8. The access operation control circuit 18 latches a logic level of the synchronous mode signal PSYNCZ in synchronization with activation of a precharge control signal PREZ and outputs the logic level of the synchronous mode signal as a synchronous mode signal SYNCZ ((d) of FIG. 8.

The access operation control circuit 18 sets the synchronous mode signal PSYNCZ to a high level when the address valid signal /ADV is at a high level during activation of the column control signal CLZ ((e) of FIG. 8). The access operation control circuit 18 latches a logic level of the synchronous mode signal PSYNCZ in synchronization wind activation of the precharge control signal PREZ and outputs the logic level of the synchronous mode signal PSYNCZ as a synchronous mode signal SYNCZ ((f) of FIG. 8. The access mode of the memory MEM is switched from an asynchronous operating mode ASMD to a synchronous operating mode SMD.

The core control circuit 20 and the peripheral control circuit 24 illustrated in FIG. 1 operate as an asynchronous operating mode ASMD while the synchronous mode signal SYNCZ is at a low level, and operates as a synchronous operating mode SMD while the synchronous mode signal SYNCZ is at a high level. For example, when the access mode is switched to a synchronous operating mode SMD by the address valid signal /ADV in the asynchronous access operation ASYNC2, an access operation synchronous with the clock signal CLK is performed from a next access operation cycle ((g) of FIG. 8).

When the access mode is switched from a synchronous operating mode SMD to an asynchronous operating mode ASMD in synchronization with the precharge control signal PREZ in the synchronous access operation SYNC2, an access operation asynchronous to the clock signal CLK is performed from a next access operation cycle ((h) of FIG. 8). The access operation control circuit 18 determines, based on the pulse width of the address valid signal /ADV, an access mode of the memory core 34 for next and subsequent access cycles, to be a synchronous, operating mode or an asynchronous operating mode. The synchronous mode signal SYNCZ indicates the determined, access mode. The synchronous mode signal SYNCZ is supplied to the core control circuit 20 and the peripheral control circuit 24.

Figure 9:
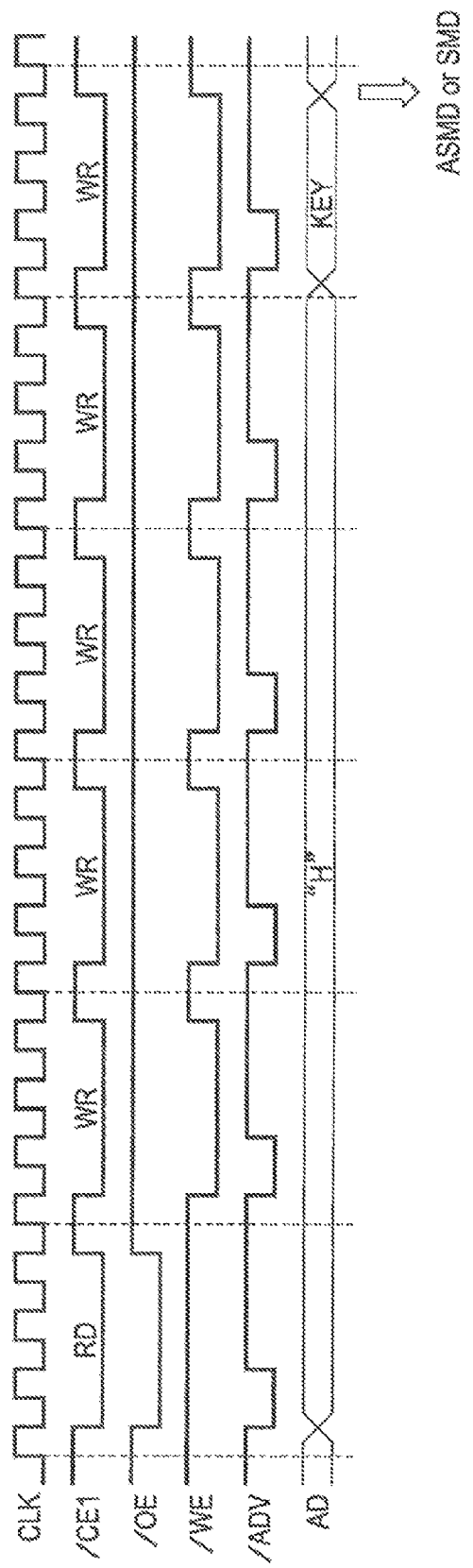
FIG. 9 illustrates an exemplary method for setting access mode.

FIG. 9 illustrates an exemplary method, for setting access mode. A read operation cycle RD and five write operation cycle WR are sequentially performed. The access mode is set to either an asynchronous operating mode ASMD or a synchronous operating mode SMD, according to the value of an address signal AD to be supplied upon the last write operation cycle WR. In all operation cycles except the last write operation cycle WR, the address signal AD is set to a high level.

In FIG. 9, the access mode is switched in six operation cycles. When the frequency of switching of the access mode is high, access efficiency may decrease. For example, since the memory MEM receives, during a preceding operation cycle, information for switching the access mode, the memory MEM does not have an operation cycle dedicated to switching of the access mode.

In aspects of the first embodiment, the specifications of the access mode or access operation, of the memory MEM are changed according to the pulse width of an address valid signal /ADV. The access mode of the memory MEM for next end subsequent cycles is changed according to an address valid signal /ADV to as supplied during an access operation. Since the access mode is switched without an access operation being stopped, access efficiency improves.

The address latch circuit 16 latches an external address signal AD in synchronization with a latch address valid signal ADVL generated cased on a failing edge of an address valid signal /ADV. The latch circuit 14 generates a latch address valid signal ADVL having a substantially constant pulse width regardless of the pulse width of the address valid signal /ADV. Therefore, even when the pulse width of the address valid signal /ADV increases, an increase in operation cycle does not occur and thus access efficiency does not decrease. Even when the pulse width of the address valid signal /ADV is changed, the address latch circuit 16 securely latches the address signal AD and thus improper operation of the memory MEM is prevented.

The logic level of a synchronous mode signal SYNCZ indicating an access mode is switched in synchronization with a precharge control signal PREZ indicating the end of an access operation. The access mode is prevented, from being switched due to the synchronous mode signal SYNCZ changing in the middle of an access operation. An interruption of the access operation due to the switching of the access mode is prevented and thus access efficiency does not decrease. The switching of the access mode during the access operation is prevented and thus improper operation of the memory MEM is prevented.

Figure 10:
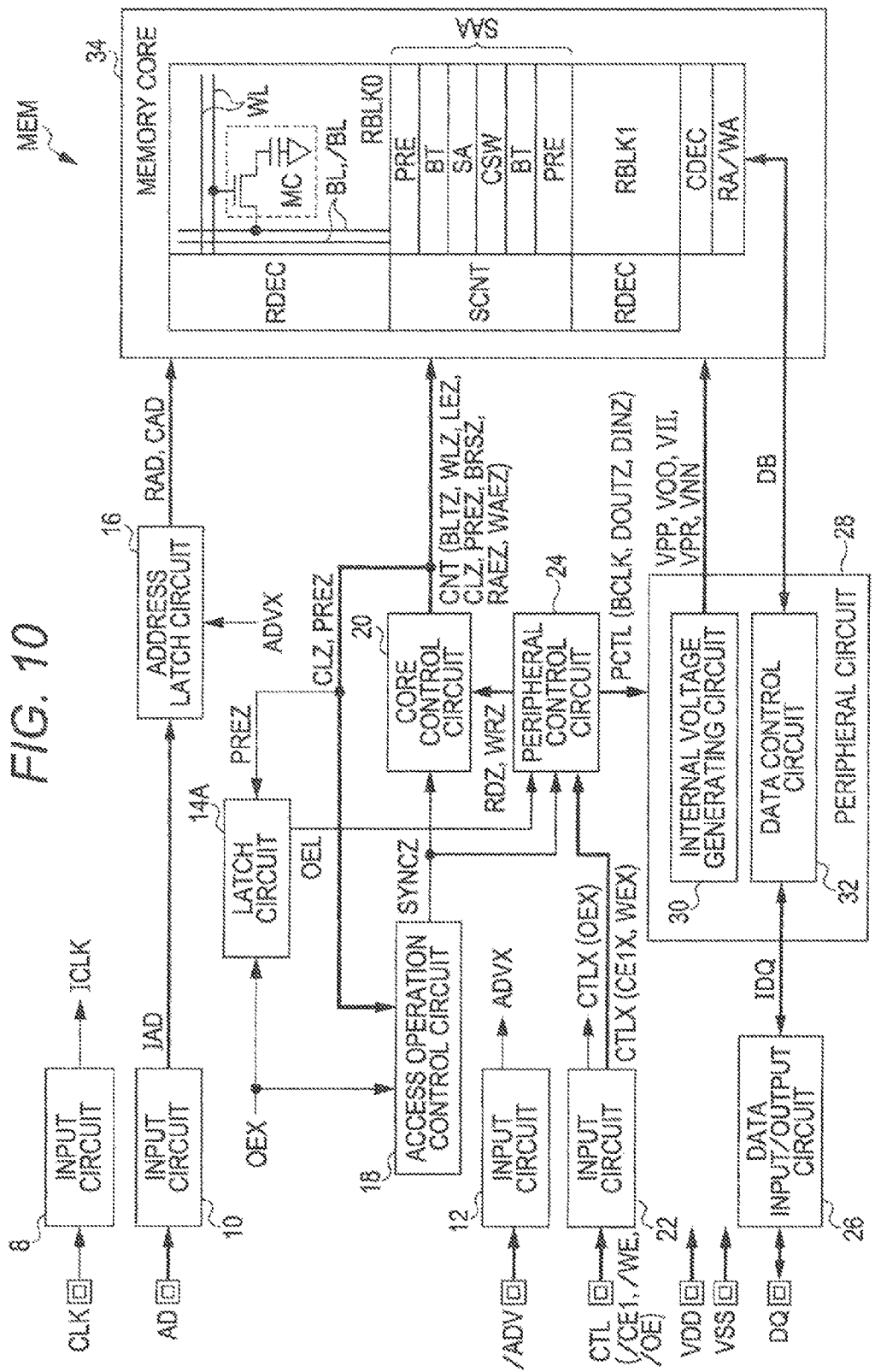
FIG. 10 illustrates a second embodiment.

FIG. 10 illustrates a second embodiment. In the second embodiment, elements similar to those in the first embodiment are denoted by the same reference numerals and description thereof is reduced or omitted. A memory MEM according to aspects of the second embodiment includes a latch, circuit 14A instead of the latch circuit 14 illustrated in FIG. 1. An address latch circuit 16 operates by receiving an address valid signal ADVX instead of a latch address valid signal ADVL. An access operation control circuit 18 operates by receiving an output enable signal OEX instead of an address valid signal ADVX. Other configurations of the second embodiment may be the same as or similar to those in FIG. 1. The memory MEM may be a pseudo SRAM type FCRAM. In aspects of the second embodiment, an output enable terminal /OE receives a command signal for performing a read operation and a control signal for switching an access mode.

Figure 11:
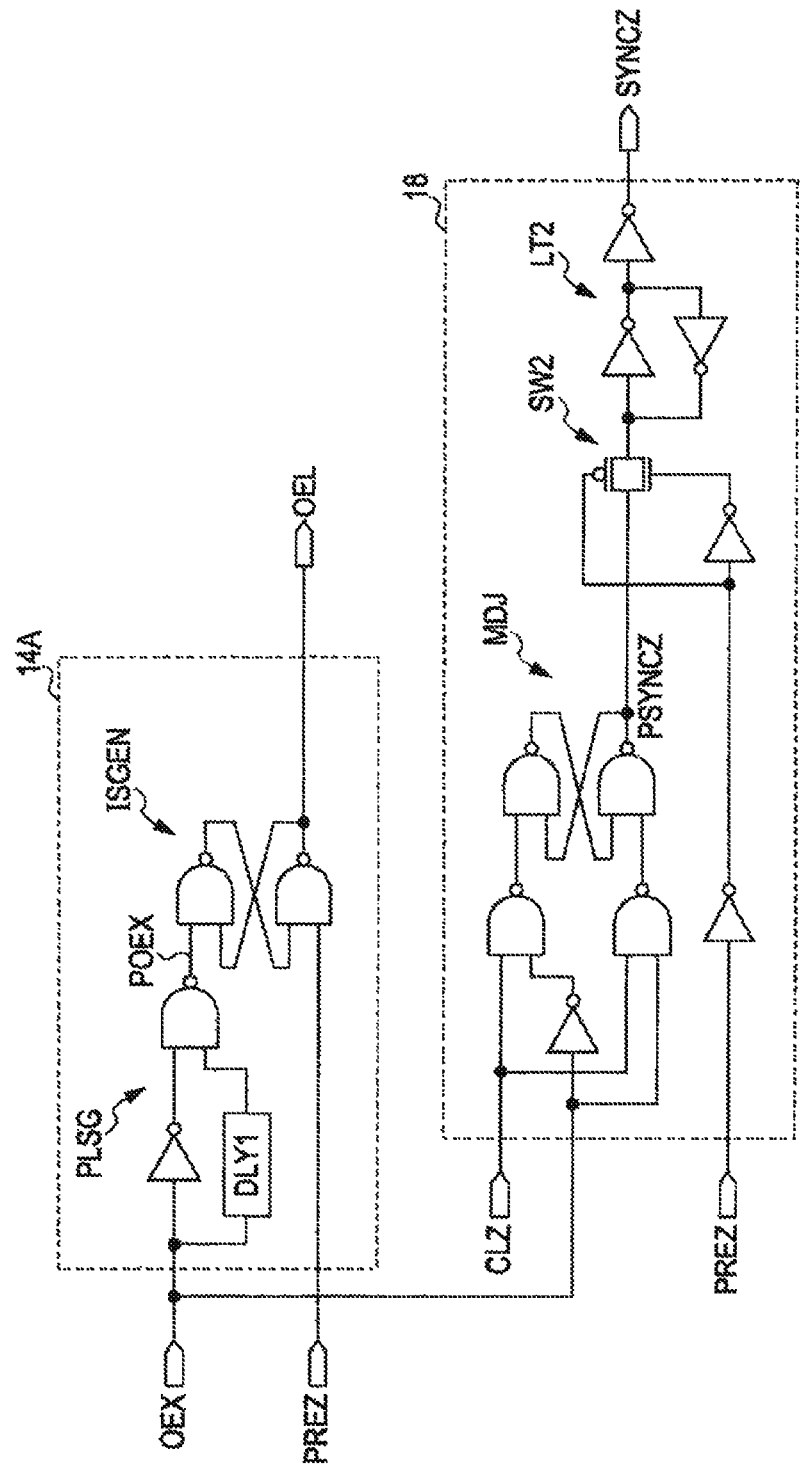
FIG. 11 illustrates an exemplary latch circuit and an exemplary access operation control circuit.

FIG. 11 illustrates an exemplary latch circuit and aspects of an exemplary access operation control circuit, The exemplary latch circuit may be the latch circuit 14A illustrated in FIG. 10. The exemplary access operation control circuit may be the access operation control circuit 18 illustrated in FIG. 10. The latch circuit 14A includes a pulse generating unit PLSG and an internal signal generating unit ISGEN. The pulse generating unit PLSG generates a pulse signal POEX in synchronization, with a falling edge of an output enable signal OEX. The internal signal generating unit ISGEN sets a latch output enable signal OEL to a low level in synchronization with the pulse signal POEX and sets the latch output enable signal OEL to a high level in synchronization with activation, or a precharge control signal PREZ. A latch output enable signal OEL having a substantially constant pulse width, for example, a low-level period, is generated regardless of the pulse width, for example, a low-level period, of an output enable signal /OE. Even, when the pulse width of the output enable signal /OE is short, a peripheral control circuit 24 performs a read operation without improper operation, using the latch output enable signal OEL.

The access operation control circuit 18 may have substantially the same function or configuration as the access operation control circuit illustrated in FIG. 2, except that the access operation control circuit 18 receives an output enable signal OEX instead, of an address valid signal ADVX. In the second embodiment, a synchronous mode signal SYNCZ is set to a low level when the output enable signal OEX is at a low level during a high-level period of a column control signal CLZ. The synchronous mode signal SYNCZ is set to a high level when the output enable signal OEX is at a high level during a high-level period of the column control signal CLZ. The synchronous mode signal SYNCZ changes in synchronization with activation of a precharge control signal PREZ.

Figure 12:
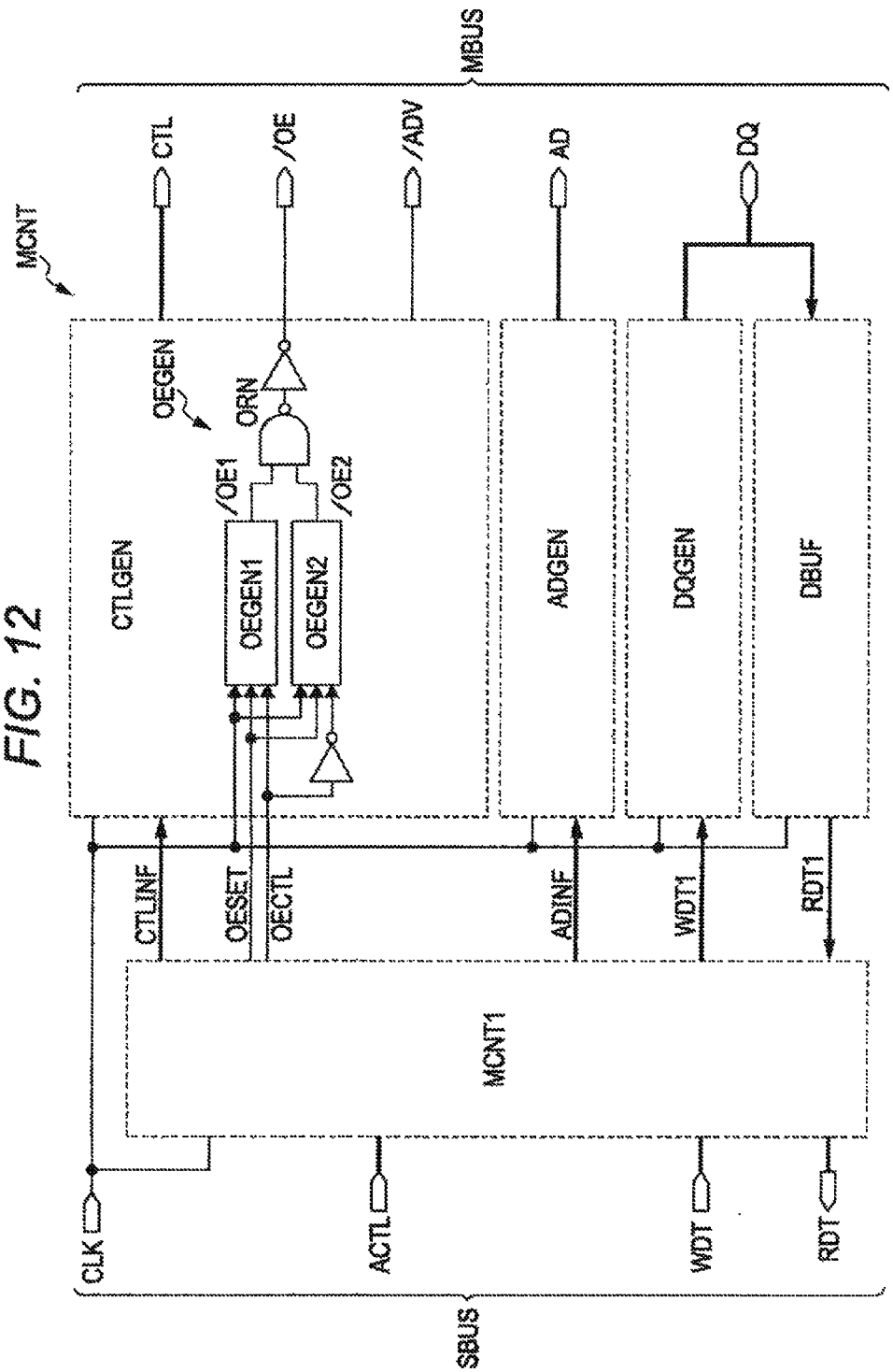
FIG. 12 illustrates an exemplary operation of a memory controller.

FIG. 12 illustrates an exemplary memory controller MCNT. The exemplary memory controller may be the memory controller illustrated MCNT in FIG. 5. The memory controller MCNT according to aspects of the second embodiment may include a signal generating circuit CTLGEN that is different from the signal generating circuit CTLGEN illustrated in FIG. 6. Other configurations of the second embodiment may be the same as or similar to those in FIG. 6, except that an address valid signal /ADV is generated by the signal generating circuit CTLGEN and a main control unit MCNT1 outputs an output enable control signal OECTL and an output enable set signal OESET instead of an address valid control signal ADVCTL and an address valid set signal ADVSET. In addition to the function of the signal generating circuit CTLGEN in FIG. 6, the signal generating circuit CTLGEN generates output enable signals /OE having different pulse widths and generates an address valid signal /ADV.

An output enable generating unit OEGEN of the signal generating circuit CTLGEN includes a first signal generating unit OEGEN1, a second signal generating unit OEGEN2, and a negative-logic OR circuit ORN. The first signal generating unit OEGEN1 activates a first pulse signal /OE1 in synchronization with the output enable set signal OESET when the output enable control signal OECTL is at a high level. The second signal generating unit OEGEN2 activates a second pulse signal /OE2 in synchronization with the output enable set signal OESET when the output enable control signal OECTL is at a low level. The activation period, for example, the low-level period, of the first pulse signal /OE1 is shorter than the activation period, for example, the low-level period, of the second pulse signal /OE2. The first pulse signal /OE1 and the second pulse signal /OE2 have different pulse widths.

Figure 13:
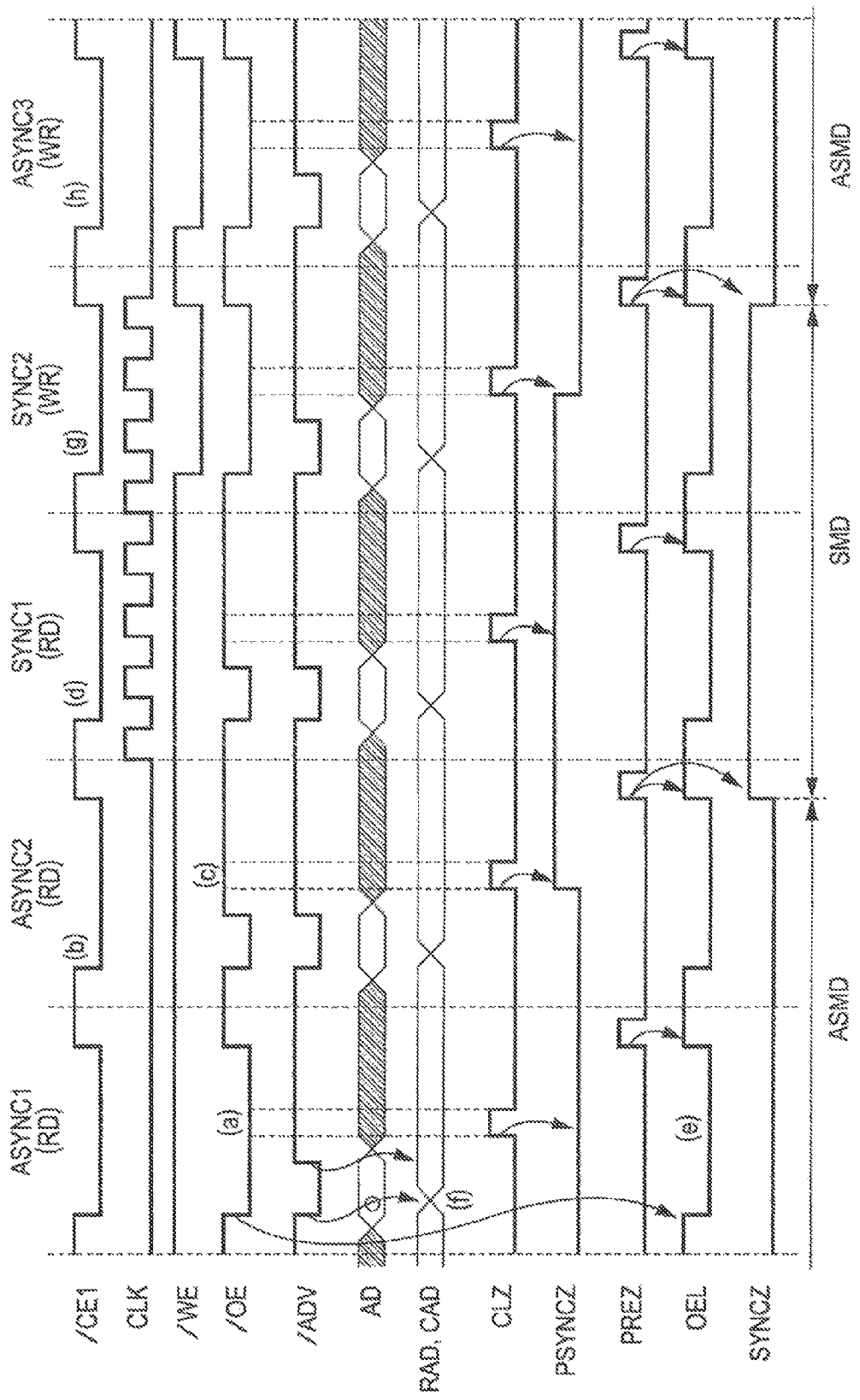
FIG. 13 illustrates an exemplary access operation to a memory.

FIG. 13 illustrates an exemplary access operation to the memory MEM illustrated in FIG. 10. Description of the same operations as those in FIG. 8 is reduced or omitted. In FIG. 13, an asynchronous access operation ASYNC1, an asynchronous access operation ASYNC2, and a synchronous access operation SYNC1 may be read operations RD. A synchronous access operation SYNC2 and an asynchronous access operation ASYNC3 may be write operations WR.

In aspects of the second embodiment, when an output enable signal /OE is at a low level during activation of a column control signal CLZ ((a) of FIG. 13), an operation of an asynchronous operating mode ASMD may be performed in a next access operation cycle ((b) of FIG. 13). When the output enable signal /OE is at a high level during activation of the column control signal CLZ ((c) of FIG. 13), an operation of a synchronous operating mode SMD is performed in a next access operation cycle ((d) of FIG. 13).

The latch circuit 14A generates a latch output enable signal OEL having a substantially constant pulse width regardless of the pulse width of the output enable signal /OE ((e) of FIG. 13). In aspects of the second embodiment, an access operation is performed using a latch output enable signal OEL having a substantially constant pulse width regardless of the low-level period, for example, the activation period, of an output enable signal /OE to be supplied from an external source. Even when the pulse width of the output enable signal /OE is changed every access operation, the memory MEM operates normally.

The address latch circuit 16 receives an address signal AD during a low-level period of an address valid signal /ADV. The address latch circuit 18 stops receiving the address signal AD in synchronization with a rising edge of the address valid signal /ADV and latches the received address signal AD ((f) of FIG. 13). The address valid signal /ADV has a substantially constant pulse width.

When a write enable signal /WE and the output enable signal /OE are activated, the write enable signal /WE is given priority and a write operation is performed ((g) and (h) of FIG. 13). At this time, a data control circuit 32 and a data input/output circuit 26 do not perform an output operation of data DQ based on the output enable signal /OE.

Figure 14:
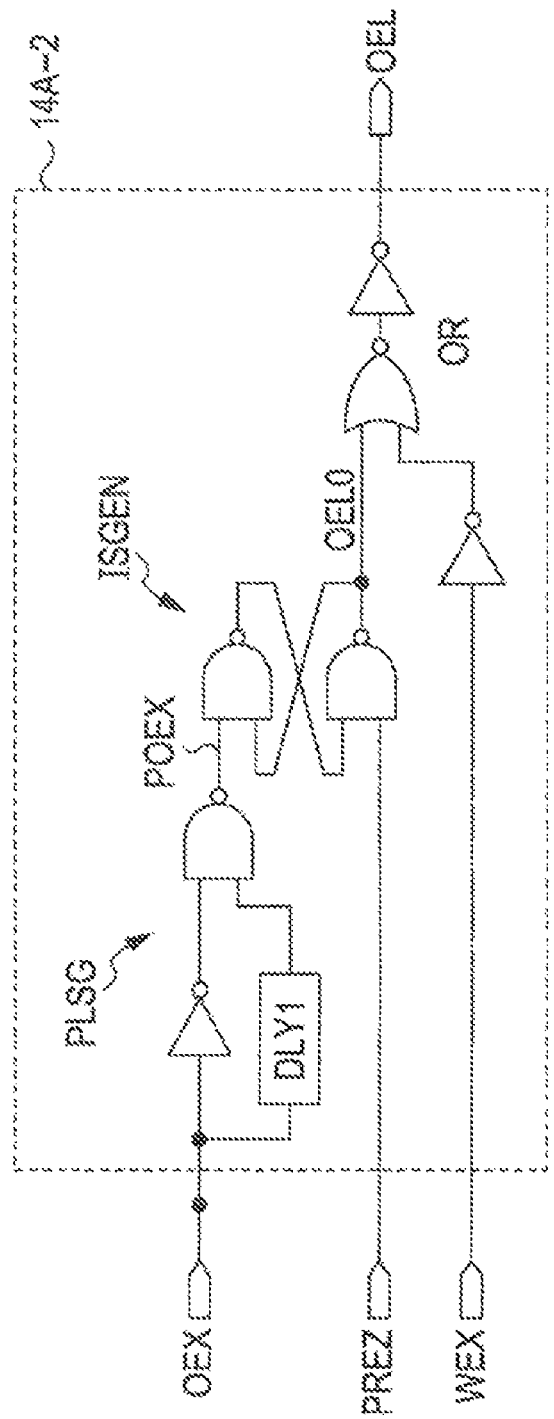
FIG. 14 illustrates an exemplary latch circuit.

FIG. 14 illustrates an exemplary latch circuit. The exemplary latch circuit may be the latch circuit 14A illustrated in FIG. 10. A latch circuit 14A-2 in FIG. 14 includes a configuration in which an OR circuit OR is added to the latch circuit 14A illustrated in FIG. 11. When a write enable signal WEX is deactivated to a high level, the OR circuit OR outputs an output signal OEL0 from an internal signal generating unit ISGEN as a latch, output enable signal OEL. When the write enable signal WEX is activated to a low level, the OR circuit OR sets the latch output enable signal OEL to a high level. The latch output enable signal OEL is prevented from being activated upon a write operation and thus improper operation of the data control circuit 32 and the data input/output circuit 26 caused by the latch output enable signal OEL is prevented.

Aspects of the second embodiment may have substantially the same effects as the first embodiment. In aspects of the second embodiment, the access mode of the memory MEM is changed according to the pulse width of an output enable signal /OE. Since the output of read data DQ is controlled using a latch output enable signal OEL having a substantially constant pulse width, change of operation timing is prevented according to the pulse width of the output enable signal /OE. For example, since an access operation is performed using a certain number of cycles, access control by the memory controller MCNT is easily performed, whereby improving access efficiency.

Figure 15:
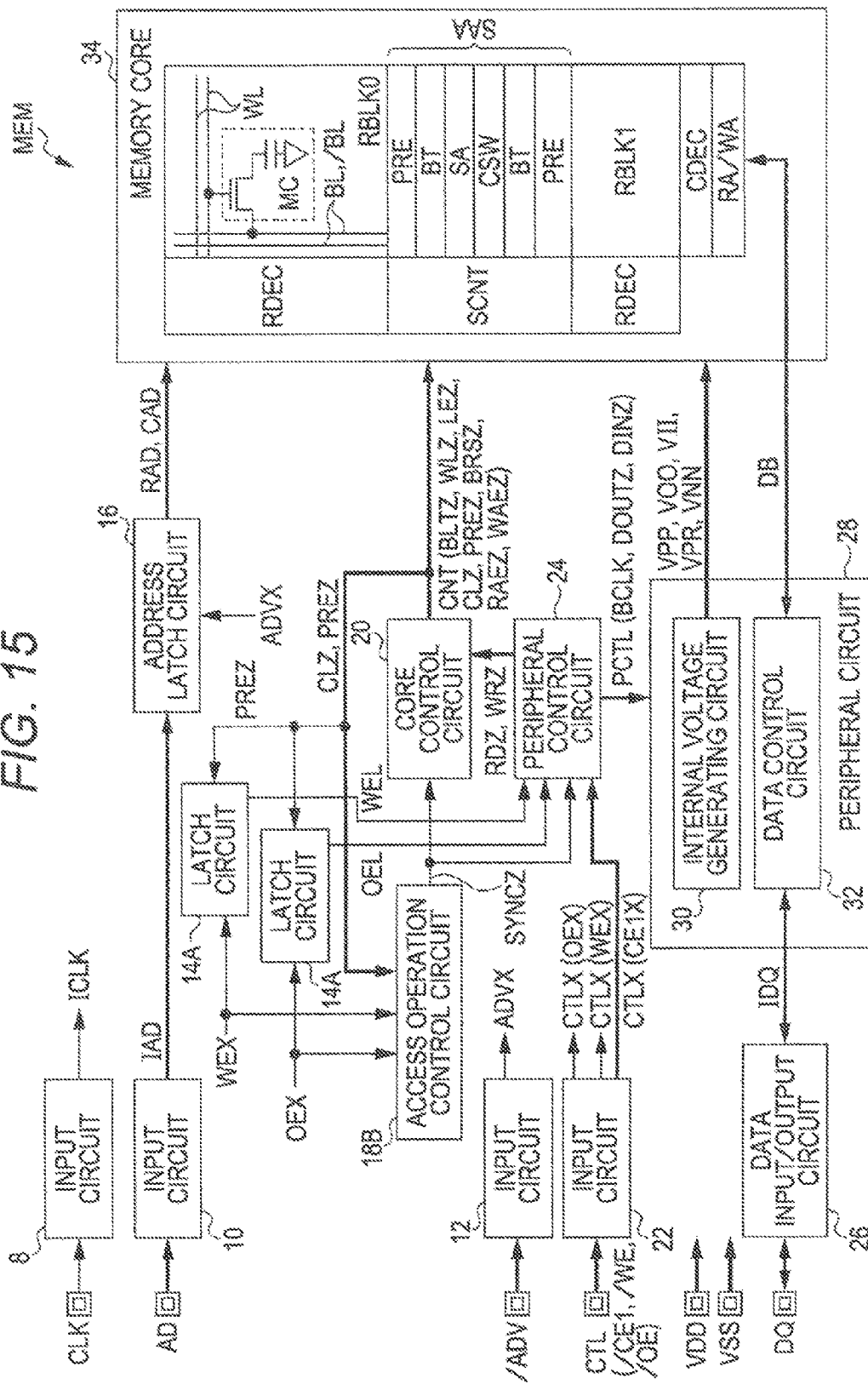
FIG. 15 illustrates a third embodiment.

FIG. 15 illustrates a third embodiment. In aspects of the third, embodiment, similar elements to those in the first and second embodiments are denoted by the same reference numerals and description thereof is reduced or omitted. A memory MEM according to the third embodiment includes latch circuits 14A respectively for an output enable signal OEX and a write enable signal WEX. The memory MEM includes an access operation control circuit 18B instead of the access operation control circuit 18 illustrated in FIG. 2. Other configurations of aspects of the third embodiment are the same as or similar to those in FIG. 1. The memory MEM may be a pseudo SRAM type FCRAM.

In aspects of the third embodiment, an output enable terminal /OE and a write enable terminal /WE receive command signals for performing a read operation and a write operation and a control signal for switching an access mode. When the pulse width of either the output enable signal OEX or the write enable signal WEX is large, the access operation control circuit 18B sets a synchronous mode signal SYNCZ to a low level in synchronization with a precharge control signal PREZ. A peripheral control circuit 24 receives a latch output enable signal OEL having a substantially constant pulse width and a latch write enable signal WEL having a substantially constant pulse width, instead of the output enable signal OEX or the write enable signal WEX that has a changing pulse width.

Figure 16:
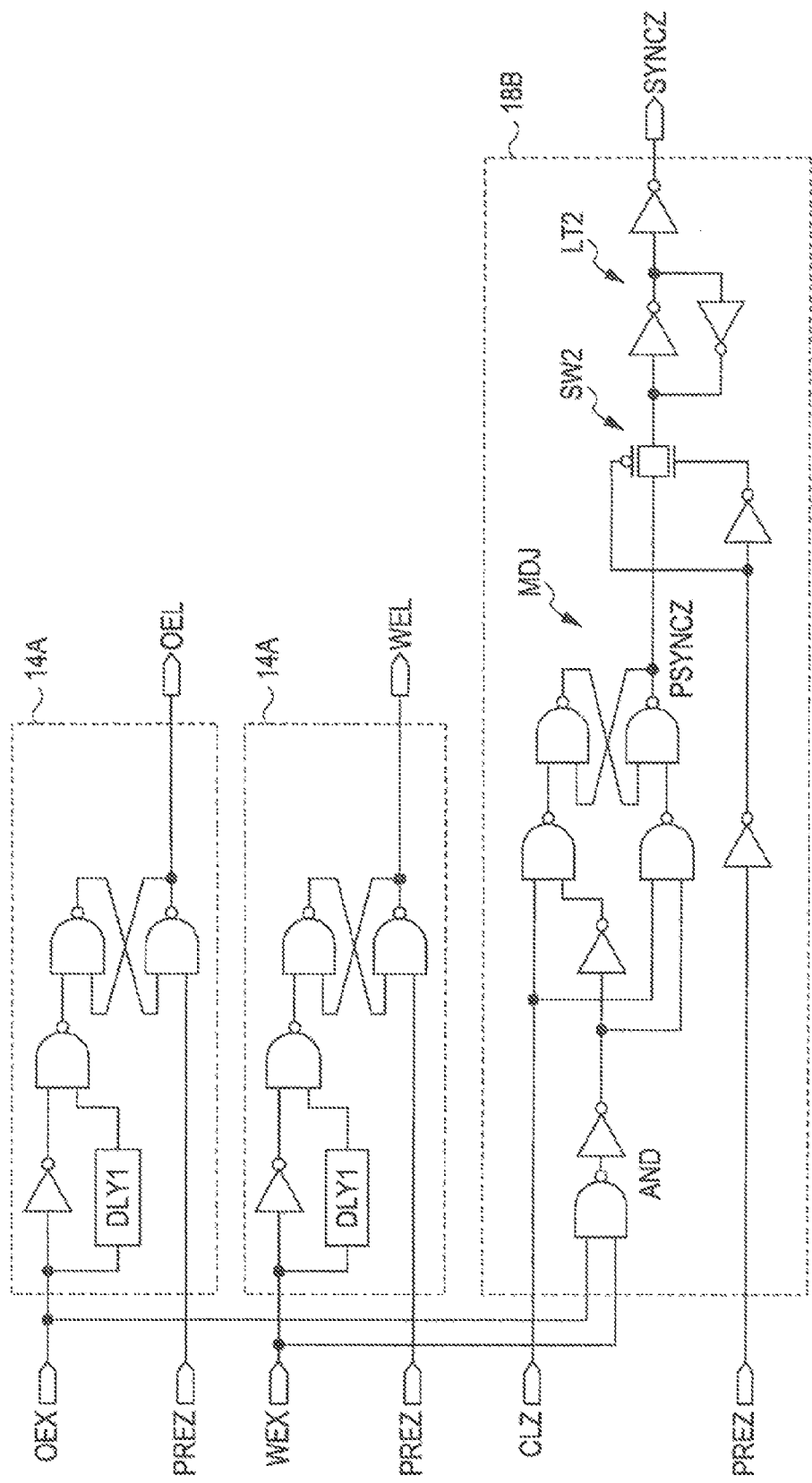
FIG. 16 illustrates an exemplary latch circuit and an exemplary access operation control circuit.

FIG. 16 illustrates an exemplary latch circuits and aspects of an exemplary access operation control circuit. The exemplary latch circuits may be the latch circuits 14A illustrated in FIG. 15 and the exemplary access operation control circuit may be the access operation control circuit 18B illustrated in FIG. 15. The logic of each latch circuit 14A is the same as or similar to that in FIG. 11. A latch circuit 14A that receives en output enable signal OEX activates a latch output enable signal OEL to a low level in synchronization with the output enable signal OEX and deactivates the latch output enable signal OEL to a high level in synchronization with a precharge control signal PREZ. A latch circuit 14A that receives a write enable signal WEX activates a latch write enable signal WEL to a low level in synchronization with the write enable signal WEX and deactivates the latch write enable signal WEL to a high level in synchronization with a precharge control signal PREZ.

The access operation control circuit 18B may have a configuration or function in which an AND circuit AND is added to the access operation control circuit 18 in FIG. 2. The access operation control circuit 18B sets a synchronous mode signal SYNCZ to a low level when either the output enable signal OEX or the writs enable signal WEX is at a low level during a high-level period of a column control, signal CLZ. The access operation control circuit 18B sets the synchronous mode signal SYNCZ to a high level when the output enable signal OEX and the write enable signal WEX are at a high level during a high-level period of the column control signal CLZ. The synchronous mode signal SYNCZ changes in synchronization with activation of a precharge control signal PREZ.

Figure 17:
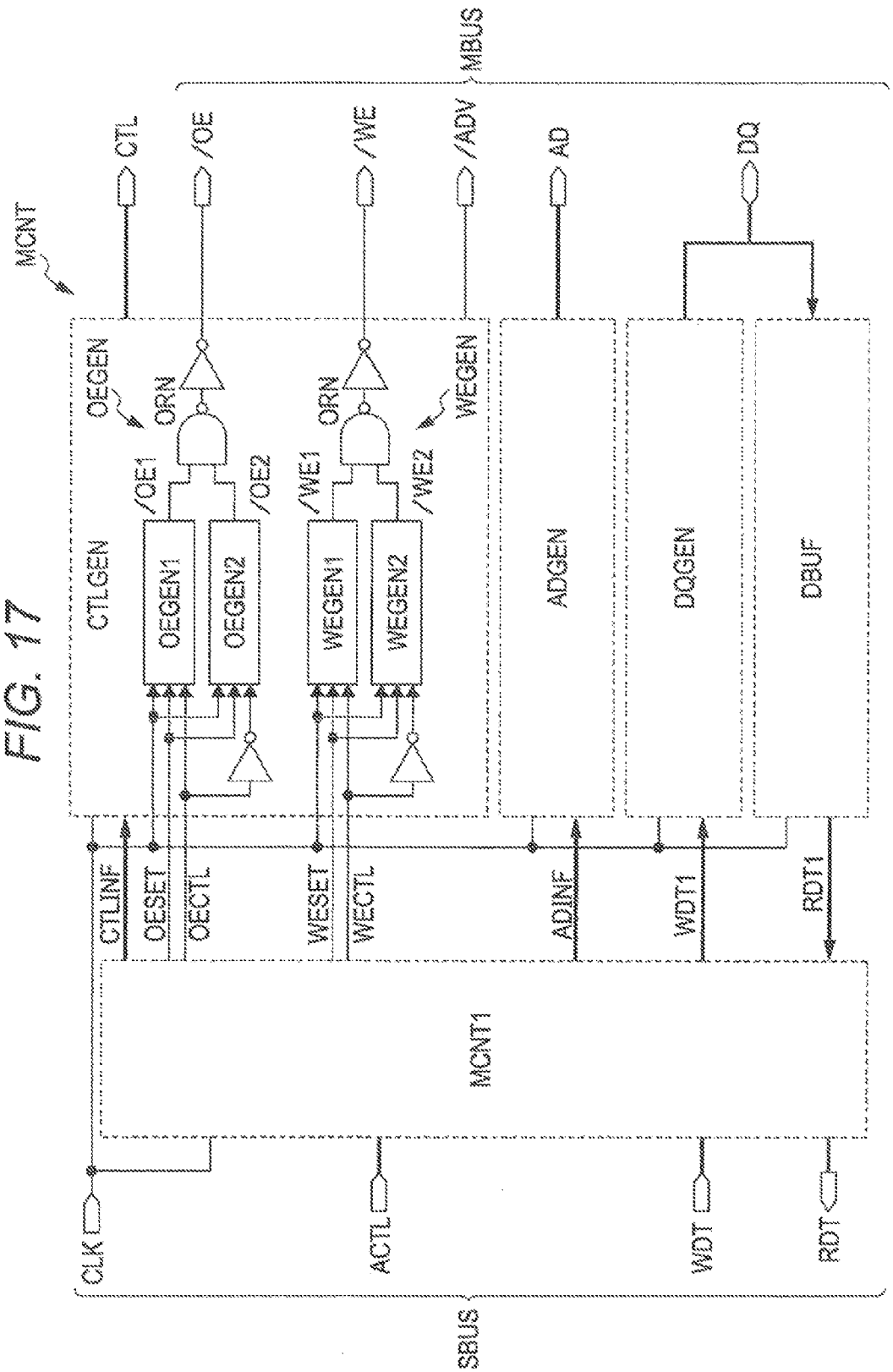
FIG. 17 illustrates an exemplary memory controller.

FIG. 17 illustrates an exemplary memory controller. The exemplary memory controller may be the memory controller MCNT illustrated in FIG. 5. The memory controller MCNT according to aspects of the third embodiment generates write enable signals /WE having different pulse widths. Other configurations of the memory controller MCNT are the same as or similar to those in FIG. 12, except that a main control trait MCNT1 outputs a write enable control signal WECTL and a write enable set signal WESET.

A write enable generating unit WEGEN of a signal generating circuit CTLGEN includes a first signal generating unit WEGEN1, a second signal generating unit WEGEN2, and a negative-logic OR circuit ORN. When the write enable control signal WECTL is at a high level, the first signal generating unit WEGEN1 activates a first pulse signal /WE1 in synchronization with the write enable set signal WESET. When the write enable control signal WECTL is at a low level, the second signal generating unit WEGEN2 activates a second pulse signal /WE2 in synchronization with the write enable set signal WESET. The activation period, for example, the low-level period, of the first pulse signal /WE1 is shorter than the activation period, for example, the low-level period, of the second pulse signal /WE2. The first pulse signal /WE1 and the second pulse signal /WE2 have different pulse widths.

Figure 18:
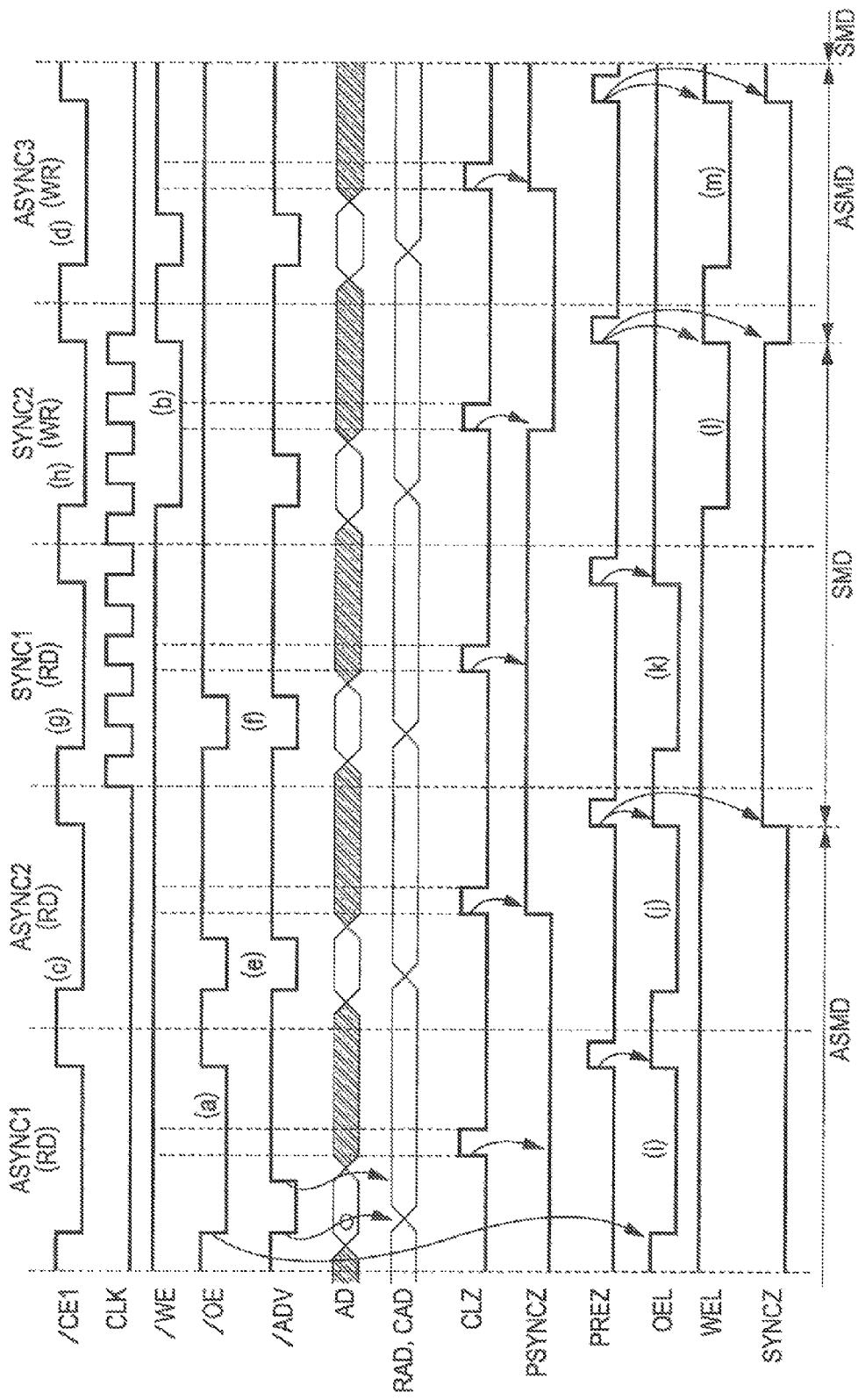
FIG. 18 illustrates an exemplary access operation to a memory.

FIG. 18 illustrates an exemplary access operation to the memory MEM illustrated in FIG. 15. In FIG. 18, description of the same operations as those in FIGS. 8 and 13 is reduced or omitted. In aspects of the third embodiment, an asynchronous access operation ASYNC1, an asynchronous access operation ASYNC2, and a synchronous access operation SYNC1 may be read operations RD. A synchronous access operation SYNC2 and an asynchronous access operation ASYNC3 may be write operations WR.

In aspects of the third embodiment, when the memory MEM detects that either an output enable signal /OE or a write enable signal /WE has a long pulse width ((a) and (b) of FIG. 18), the memory MEM operates in an asynchronous operating mode in a next operation cycle ((c) and (d) of FIG. 18). When the memory MEM detects that the output enable signal /OB and the write enable signal /WE have short pulse widths ((e) and (f) of FIG. 18). The memory MEM operates in a synchronous operating mode in a next operation cycle ((g) and (h) of FIG. 18). The memory controller MCNT that accesses the memory MEM, etc., do not output an output enable signal /OE upon a write operation. By a memory controller being changed to a minimum, a memory controller MCNT for accessing the memory MEM illustrated in FIG. 15 may be designed.

The waveforms of signals including an address valid signal /ADV to a precharge control signal PREZ are substantially the same as or similar to those in FIG. 13. A latch output enable signal OEL is generated in synchronization with the output enable signal /OE ((i), (j), and (k) of FIG. 18). A latch write enable signal WEL is generated in synchronization with the write enable signal /WE ((l) and (m) of FIG. 18).

Aspects of the third embodiment have substantially the same effects as the first and second embodiments. In aspects of the third embodiment, an output enable signal /OE may not be output in a write operation cycle. Access control by the memory controller MCNT may be facilitated. By using design data of an existing memory controller, a memory controller MCNT may be easily designed.

Figure 19:
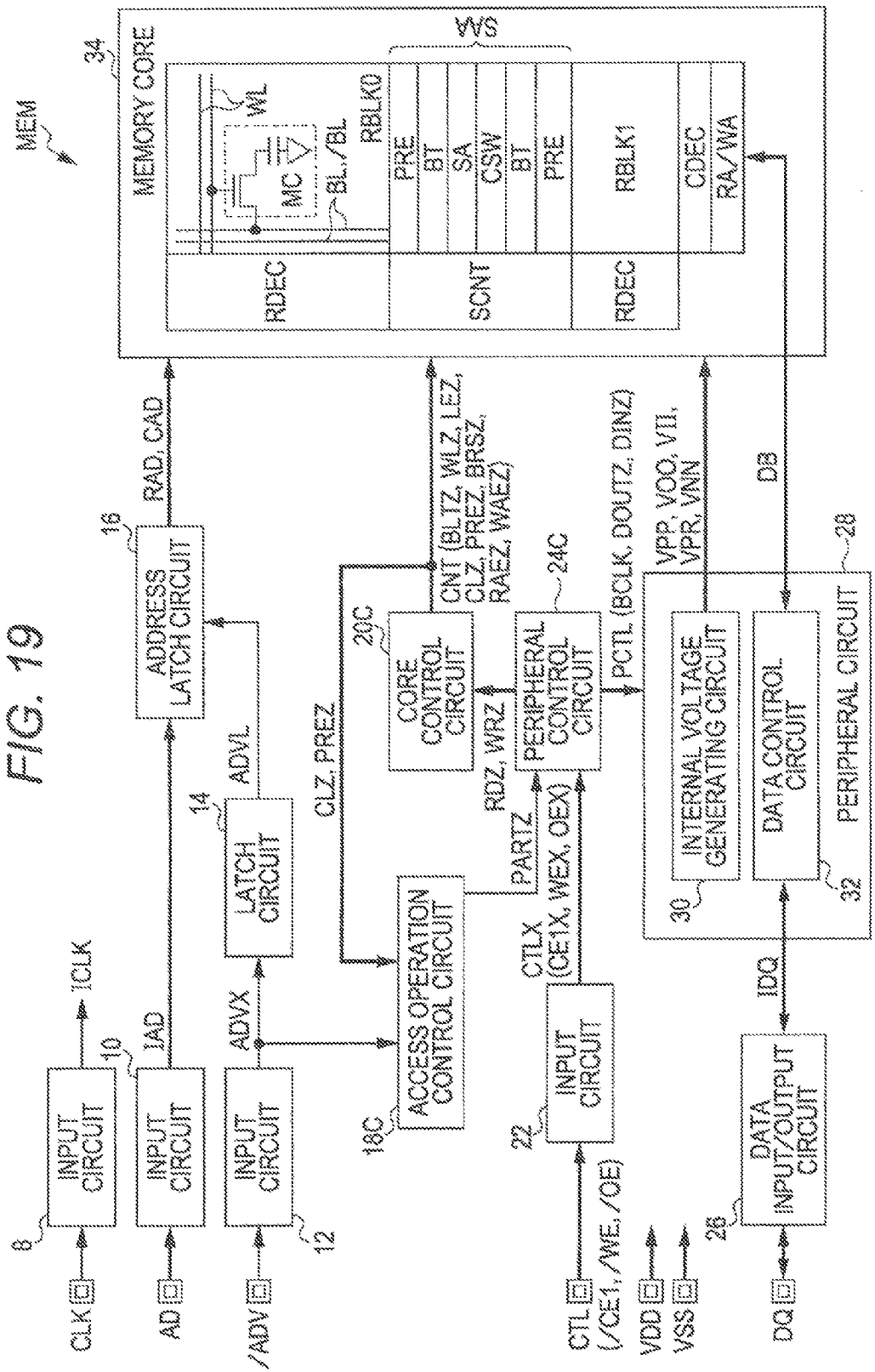
FIG. 19 illustrates a fourth embodiment.

FIG. 19 illustrates aspects of a fourth embodiment. In the fourth embodiment, similar elements to these in the first to third embodiments are denoted by the same reference numerals and description thereof is reduced or omitted. A memory MEM according to aspects of the fourth embodiment includes an access operation control circuit 18C, a core control circuit 20C, and a peripheral control circuit 24C, instead of the access operation control circuit 18, the core control circuit 20, and the peripheral control circuit 24 in FIG. 1. Other configurations of the memory MEM are substantially the same as or similar to those in FIG. 1. A memory controller MCNT may have the same or similar configuration to that in FIG. 6.

The memory MEM may be a pseudo SRAM type FCRAM. The memory MEM is of a clock synchronous type but may be of a clock asynchronous type. In the fourth embodiment, an access mode, for example, a partial refresh mode or a normal refresh mode, may be changed based on the pulse width of an address valid signal /ADV.

The access operation control circuit 18C compares timing a timing of a rising edge of an address valid signal ADVX with a timing of a rising edge of a column control signal CLZ and sets a logic level of a partial mode signal PARTZ according to a result of the comparison. The partial mode signal PARTZ sets an area of memory cells MCs, to which a refresh operation is performed, in memory blocks RBLK0 and RBLK1. When the partial mode signal PARTZ is at a high level, all memory cells MCs in the memory blocks RBLK0 and RBLK1 are periodically refreshed. This refresh operation is called a normal refresh mode. When the partial mode signal PARTZ is an a low level, half of the memory cells MCs in the memory blocks RBLK0 and RBLK1 are periodically refreshed. This refresh mode is called a partial refresh mode. A refresh operation during the partial refresh mode is called a partial refresh operation. By setting the area to be refreshed to be small, the power consumption of the memory MEM is reduced. A standby current during a standby mode where a refresh operation is periodically performed, for example, during when /CE1=a high level, may be reduced.

The core control circuit 20C and the peripheral control circuit 24C cause the core control circuit 20 and the peripheral control circuit 24 illustrated in FIG. 1 to perform a partial refresh operation. For example, a refresh address counter in the core control circuit 20C sets the most significant bit of a refresh address signal to a low level during a partial refresh mode. A refresh request generating circuit in the core control circuit 20C sets an internal refresh command generation cycle to twice that for a normal refresh mode.

Figure 20:
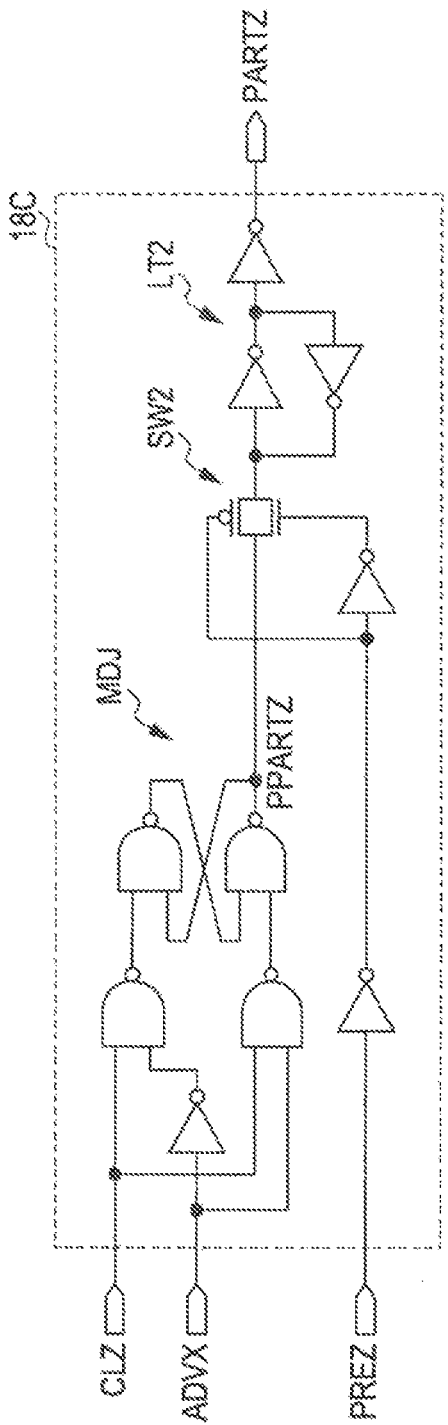
FIG. 20 illustrates an exemplary access operation control circuit.

FIG. 20 illustrates an exemplary access operation control circuit. The exemplary access operation control circuit may be the access operation circuit 18C illustrated in FIG. 19. The access operation control circuit 18C has the same logic as the access operation control circuit 18 illustrated in FIG. 2. A mode determining unit MDJ sets a partial mode signal PPARTZ to a low level when an address valid signal ADVX is at a low level during a high-level period of a column control signal CLZ. The mode determining unit MDJ sets the partial mode signal PPARTZ to a high level when the address valid signal ADVX is at a high level during a high-level period of the column control signal CLZ. A latch LT2 latches a logic level of the partial mode signal PPARTZ to be supplied in synchronization with a precharge control signal PREZ and outputs the logic level of the partial mode signal PPARTZ as a partial mode signal PARTZ.

Figure 21:
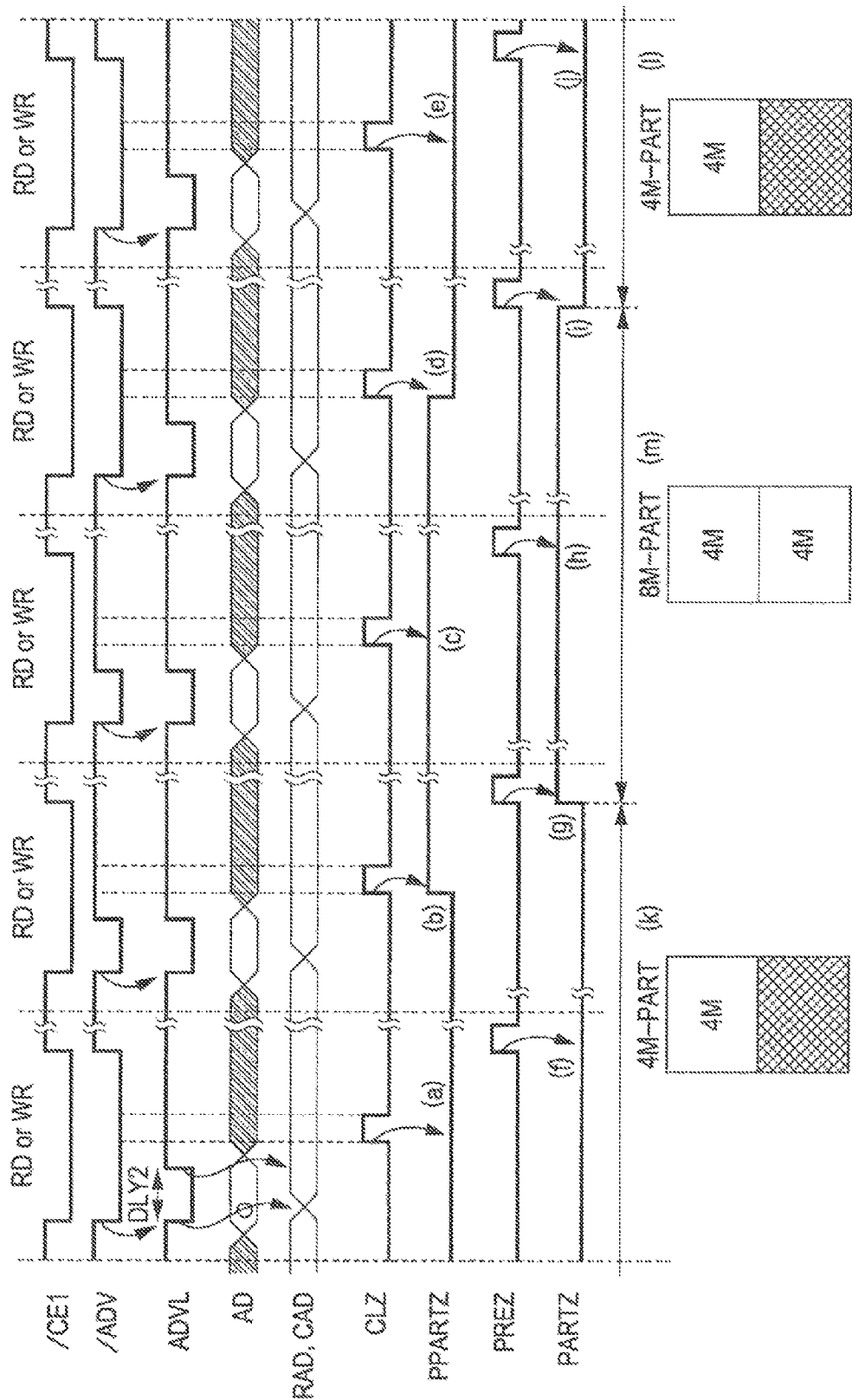
FIG. 21 illustrates an exemplary access operation to a memory.

FIG. 21 illustrates an exemplary access operation to the memory MEM illustrated in FIG. 19. In FIG. 21, description of substantially the same operations as those in FIG. 8 is reduced or omitted. A read operation RD or a write operation WR is performed five times in a row. For example, the memory controller MCNT that accesses the memory MEM illustrated in FIG. 5 supplies to the memory MEM a read command RD or a write command WR five times in a row.

The waveforms of signals including a chip enable signal /CE1 to a column control signal CLZ are substantially the same as those in FIG. 8. In the fourth embodiment, a partial mode signal PPARTZ changes to substantially the same logic level as that of an address valid signal /ADV (=ADVL) in synchronization with a column control signal CLZ ((a) to (e) of FIG. 21). A partial mode signal PARTZ changes to substantially the same logic level as that of the partial mode signal PPARTZ in synchronization with a precharge control signal PREZ ((f) to (j) of FIG. 21).

While, the partial mode signal PARTZ is at a low level, the memory MEM operates in a partial refresh mode, for example, 4M-PART ((k) and (l) of FIG. 21). For example, the memory MEM according to the fourth embodiment includes memory cells or a storage capacity of 8 megabits. A rectangle appended with "4M" indicates an area of memory cells MCs to be refreshed. A double-hatched rectangle indicates an area of memory cells MCs where refresh is prohibited.

In a partial refresh mode, memory cells of 4 megabits are periodically refreshed and data of 4 megabits is held. While the partial, mode signal PARTZ is at a high level, the memory MEM operates in a normal refresh mode, for example, 8M-PART ((m) of FIG. 21). In the normal refresh mode, memory cells of a 8 megabits are periodically refreshed and data of 8 megabits is held.

Aspects of the fourth embodiment may have substantially the same effects as the first to third embodiments. In aspects of the fourth embodiment, the access mode of the memory MEM may be changed according to the pulse width of an address valid signal /ADV. According to an address valid signal /ADV to be supplied during an access operation, a refresh area for next and subsequent cycles is changed. Switching of the access mode is performed without the access operation being stopped and thus access efficiency improves.

Figure 22:
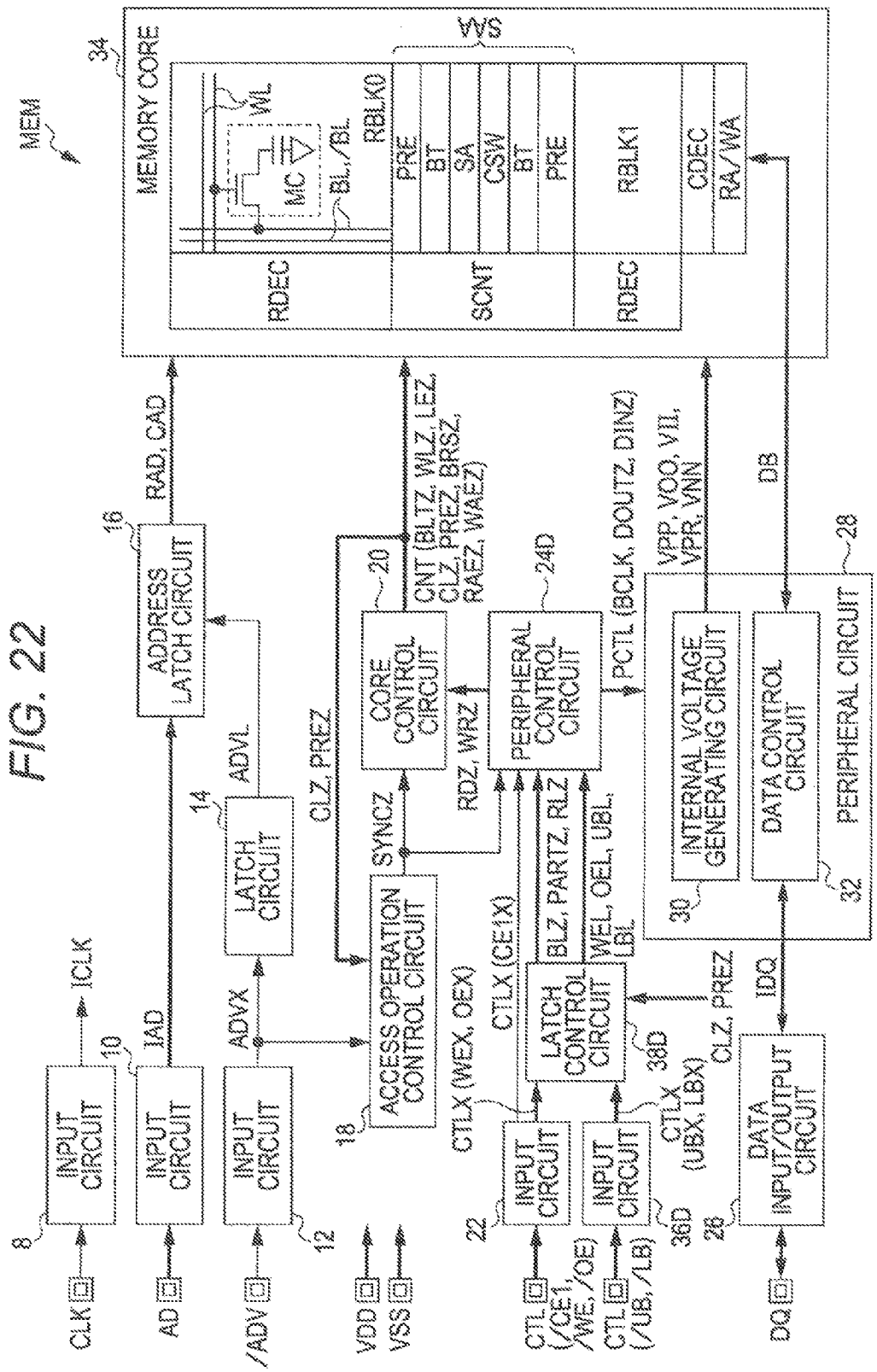
FIG. 22 illustrates a fifth embodiment.

FIG. 22 illustrates a fifth embodiment. In the fifth embodiment, similar elements to those in the first to fourth embodiments are denoted by the same reference numerals and a detailed description thereof is reduced or omitted. A memory MEM according to the fifth embodiment includes a peripheral control circuit 24D instead of the peripheral control circuit 24 illustrated in FIG. 1. The memory MEM includes an input circuit 36D and a latch control circuit 38D. Other configurations of the memory MEM are the same as or similar to those in FIG. 1. A memory controller MCNT has substantially the same functions as those of the memory controller MCNT illustrated in FIG. 17, except that the memory controller MCNT includes a signal generating circuit that changes activation periods, for example, pulse widths, of an address valid signal /ADV, an upper byte control signal /UB, and a lower byte control signal /LB.

The memory MEM may be a pseudo SRAM type FCRAM. In aspects of the fifth embodiment, a plurality of access modes, for example, a synchronous mode/asynchronous mode, a partial refresh mode/normal refresh mode, a burst length BL, and a read latency RL are changed based on the pulse widths of a input signal /ADV, /WE, /OE, /UB, or /LB.

One input circuit 36D receives an upper byte control signal /UB and a lower byte control signal /LB as control signals CTL and outputs an upper byte control signal UBX and a lower byte control signal LBX as internal control signals CTLX. The latch control circuit 38D outputs a latch write enable signal WEL, a latch output enable signal OEL, a latch upper byte control signal UBL and a latch lower byte control signal LBL, according to a write enable signal WEX, an output enable signal OEX, the upper byte control signal UBX and the lower byte control signal LBX, respectively.

The latch control circuit 38D outputs a burst mode signal BLZ according to the write enable signal WEX and the output enable signal OEX. The latch control circuit 38D outputs a partial mode signal PARTZ according to the upper byte control signal UBX and outputs a latency mode signal RLZ according to the lower byte control signal LBX.

The peripheral control circuit 24D has substantially the same function as that of the peripheral control circuit 24C illustrated in FIG. 19 and switches a burst length BL and a read latency RL according to a burst mode signal BLZ and a latency mode signal RLZ. The burst length BL represents the number of a data signal to be output from data terminals DQ in response to a single read command and the number of a data signal to be received by the data terminals DQ in response to a single write command. The read latency RL represents the number of clocks before the output of read data DQ starts after receiving a read command.

For example, the peripheral control circuit 24D sets the burst length BL to "8" when the burst mode signal BLZ is at a low level, and sees the burst length BL to "16" when the burst mode signal BLZ is at a high level. For example, the peripheral control circuit 24D sets the read latency RL to "5" when the latency mode signal RLZ is at a low level, and sets the read latency RL to "7" when the latency mode signal RLZ is at a high level.

Figure 23:
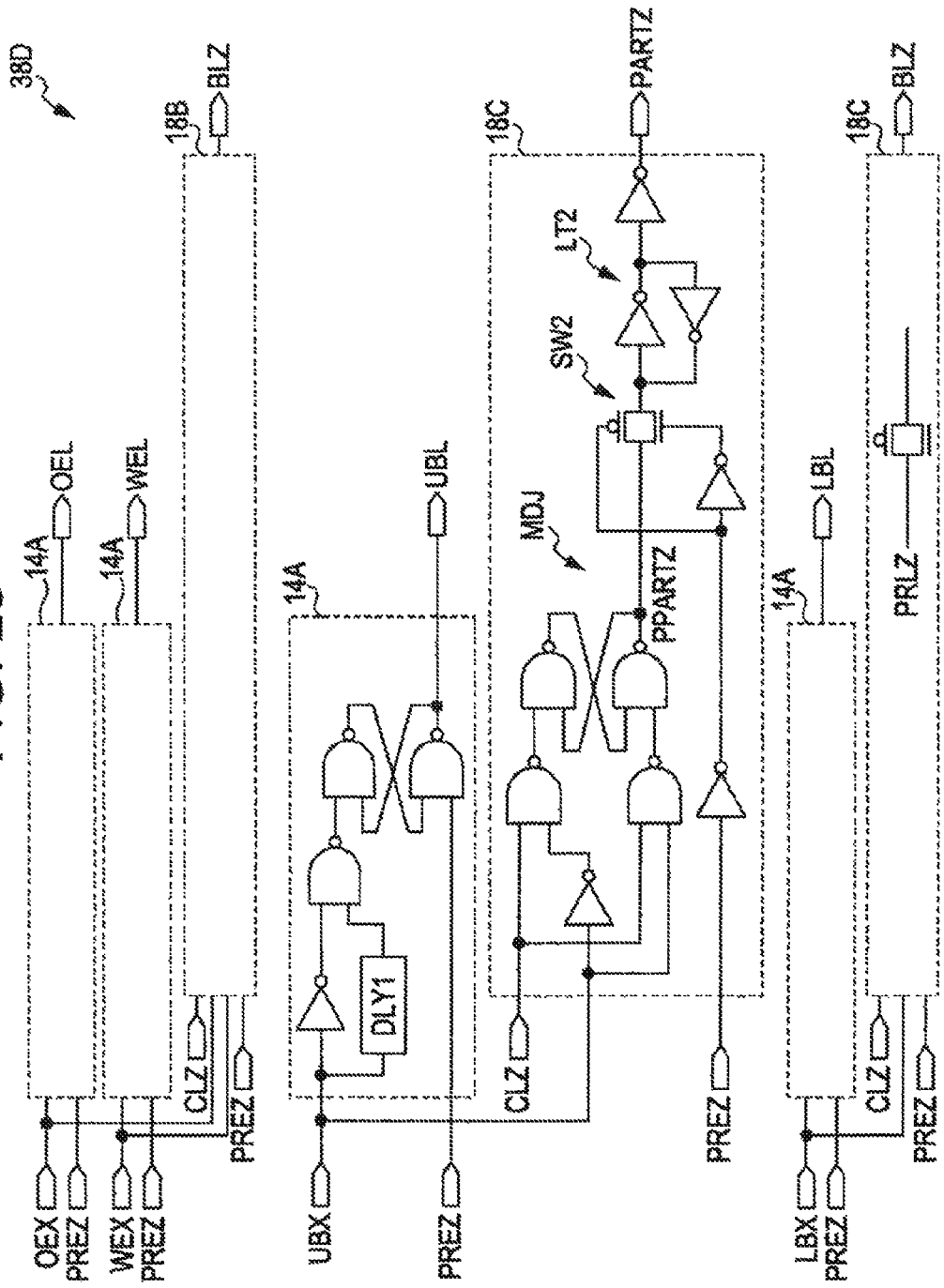
FIG. 23 illustrates an exemplary latch control circuit.

FIG. 23 illustrates an exemplary latch control circuit. The exemplary latch control circuit may be the latch control circuit 38D illustrated in FIG. 22. Latch circuits 14A that respectively receive an output enable signal OEX and a write enable signal WEX have substantially the same function as that of the latch circuit 14A in FIG. 16. An access operation control circuit 18B that receives the output enable signal OEX and the write enable signal WEX has substantially the same function as that of the access operation control circuit 18B is FIG. 16, except that the access operation control circuit 18B outputs a burst mode signal BLZ instead of a synchronous mode signal SYNCZ.

A latch circuit 14A that receives an upper byte control signal UBX has substantially the same function as that of the latch circuit 14A in FIG. 11, except that an input signal is different. The latch circuit 14A outputs a latch upper byte control signal UBL having a substantially constant pulse width regardless of the pulse width of the upper byte control signal UBX. An access operation control circuit 18C that receives the upper byte control signal UBX has substantially the same function as that of the access operation control circuit 18C illustrated in FIG. 20, except that an input signal is different.

A latch circuit 14A that receives a lower byte control signal LBX has substantially the same function, as that of the latch circuit 14A illustrated in FIG. 11, except that an input signal is different. The latch circuit 14A outputs a latch lower byte control signal PEP having a substantially constant pulse width regardless of the pulse width of the lower byte control signal LBX. An access operation control circuit 18C that receives the lower byte control signal LBX has substantially the same function as that of the access operation control circuit 18C illustrated in FIG. 20, except that an input signal is different. The access operation control circuit 18C sets a latency mode signal RLZ to a low level when the lower byte control signal LBX is at a low level during a high-level period of a column control signal CLZ. The access operation control circuit 18C sets the latency mode signal RLZ to a high level when the lower byte control signal LBX is at a high level during a high-level period of the column control signal CLZ.

Figure 24:
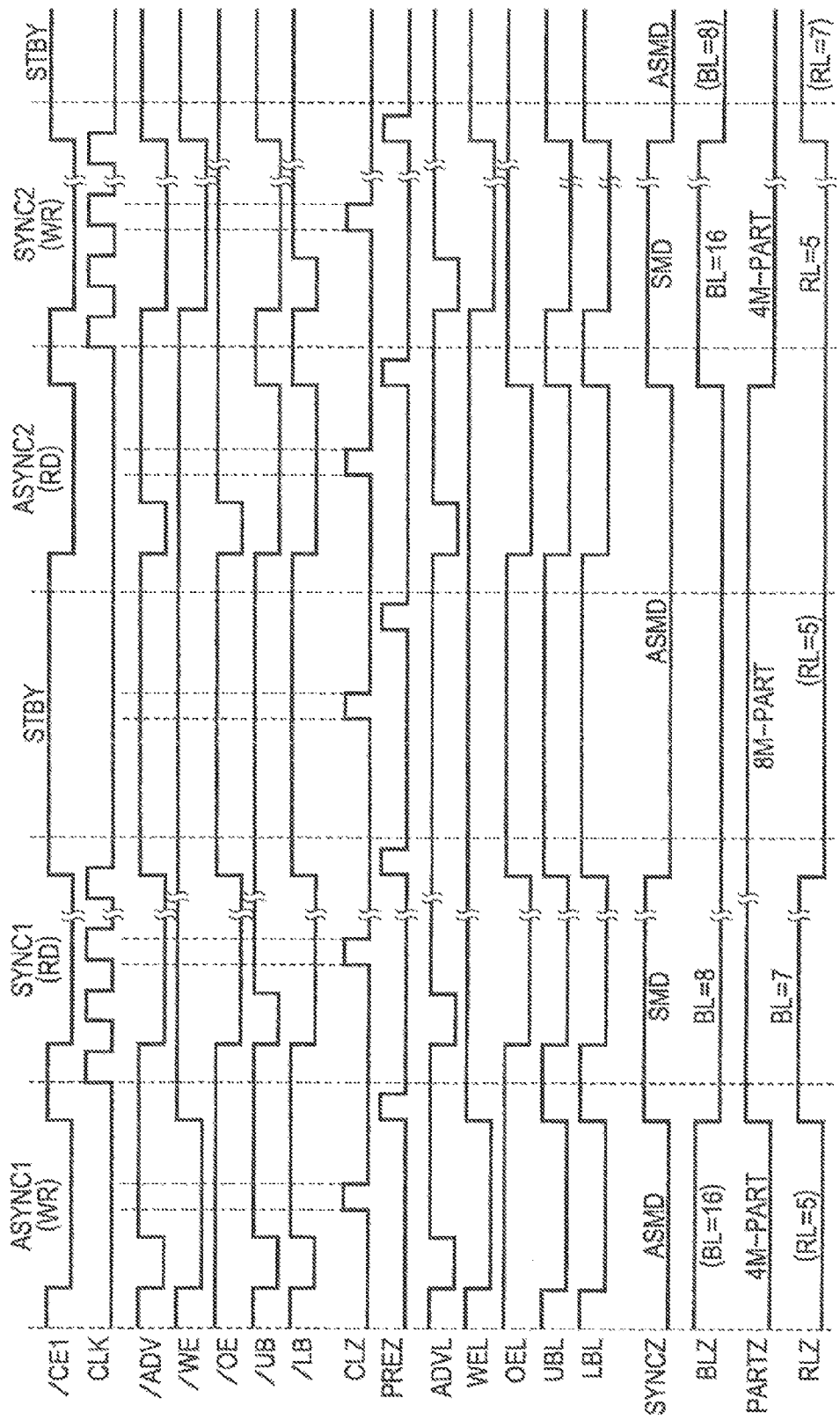
FIG. 24 illustrates an exemplary access operation to a memory.

FIG. 24 illustrates an exemplary access operation to the memory MEM illustrated in FIG. 22. In FIG. 24, description of substantially the same operations as those in FIGS. 8, 18, and 21 is reduced or omitted. An asynchronous access operation ASYNC1 and a synchronous access operation SYNC1 are performed and after a standby period STBY, an asynchronous access operation ASYNC2 and a synchronous access operation SYNC2 are performed. The asynchronous access operation ASYNC1 and the synchronous access operation ASYNC2 may be write operations WR. The synchronous access operation SYNC1 and the asynchronous access operation ASYNC2 may be read operations RD. The standby period STBY may be a period during which a chip enable signal /CE1 is at a low level.

In aspects of the fifth embodiment, a synchronous operating mode SMD or an asynchronous operating mode ASMD is set according to the pulse widen of an address valid signal /ADV. A burst length BL may be set to "8" or "16" according to the pulse width or a write enable signal /WE and an output enable signal /OE. A partial refresh mode, for example, 4M-PART, or a normal refresh mode, for example, 8M-PART, may be set according to the pulse width of an upper byte control signal /UB. A read latency RL may be set to "5" or "7" according to the pulse width of a lower byte control signal /LB. The peripheral control circuit 24D performs a synchronous operation in a synchronous operating mode SMD according to the set burst length BL and read latency RL.

Aspects of the fifth embodiment may have substantially the same effects as the first to fourth embodiments. In the fifth embodiment, using a control signals CTL, for example, /ADV, /WE, /OE, /UB, or /LB, a plurality of access modes are contemporaneously changed without an access operation being stopped. As a result, access efficiency improves.

Figure 25:
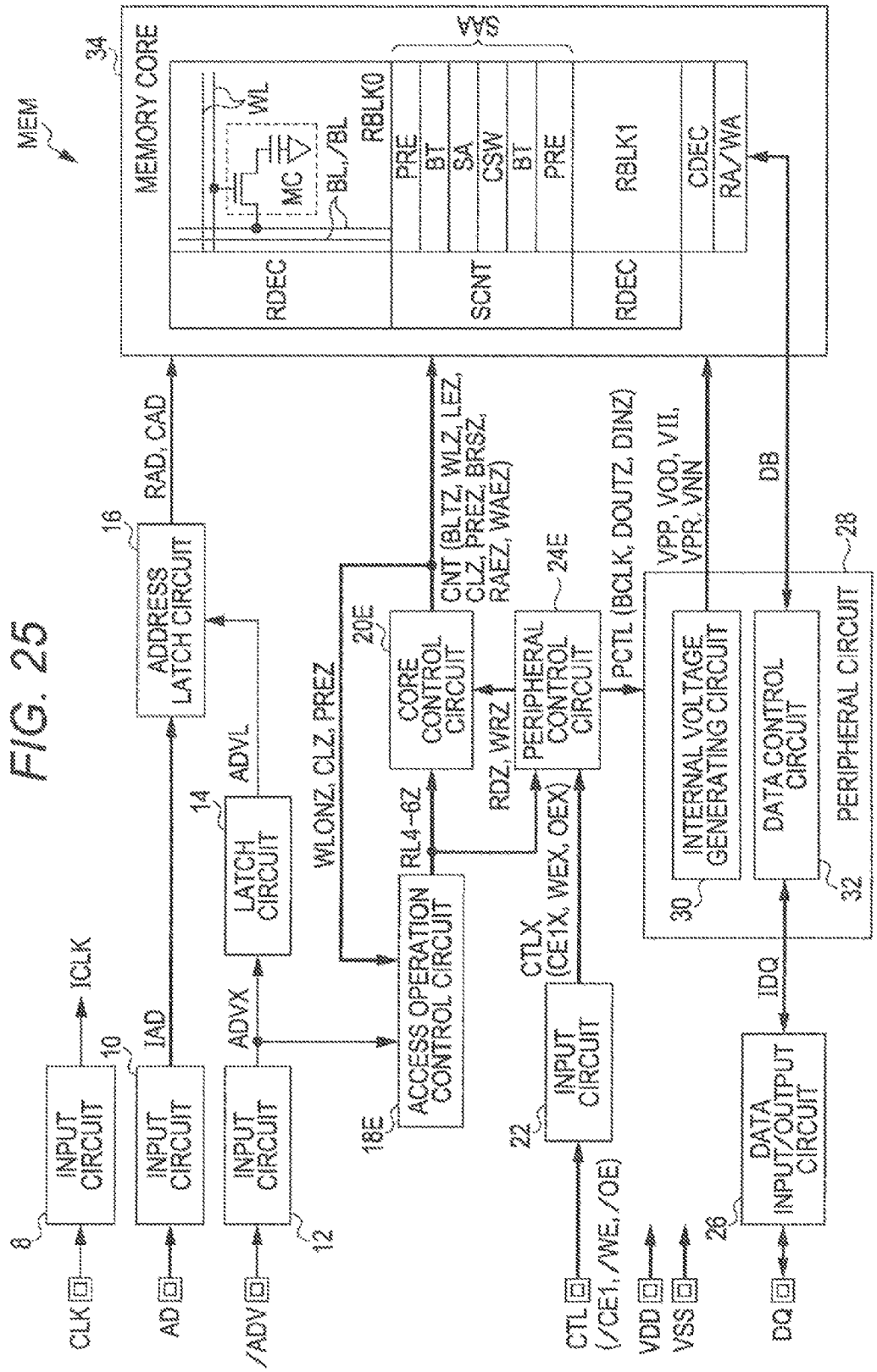
FIG. 25 illustrates a sixth embodiment.

FIG. 25 illustrates a sixth embodiment. Similar elements to those in the first to fifth embodiments are denoted by the same reference numerals and description thereof is reduced or omitted. A memory MEM according to the sixth embodiment includes an access operation control circuit 18E, a core control circuit 20E, and a peripheral control circuit 24E, instead of the access operation control, circuit 18, the core control circuit 20, and the peripheral control circuit 24 illustrated in FIG. 1. Other configurations of the aspects of fifth embodiment may be the same as or similar to those in FIG. 1. The memory MEM may be a pseudo SRAM type FCRAM. In aspects of the sixth embodiment, an access mode, for example, a read latency RL, is changed based on the pulse width of an input signal /ADV.

The access operation control circuit 18E compares a rising edge of an address valid signal ADVX with a rising edge of each of a word control signal WLONZ and a column control signal CLZ. The access operation control circuit 18E sets one of read latency signals RL4Z, RL5Z, and RL6Z to a high level, according to results of the comparison. The word control signal WLONZ is a pulse signal to be generated in synchronization with a rising edge of a word control signal WLZ.

The core control circuit 20E and the peripheral control circuit 24E have substantially the same functions as those of the core control circuit 20 and the peripheral control circuit 24 illustrated in FIG. 1, and change a read latency RL. The core control circuit 20E and the peripheral control circuit 24E may be set read latencies RL to "4, 5, and 6" when each of the read latency signals RL4Z, RL5Z, and RL6Z is at a high level, and perform a read operation.

Figure 26:
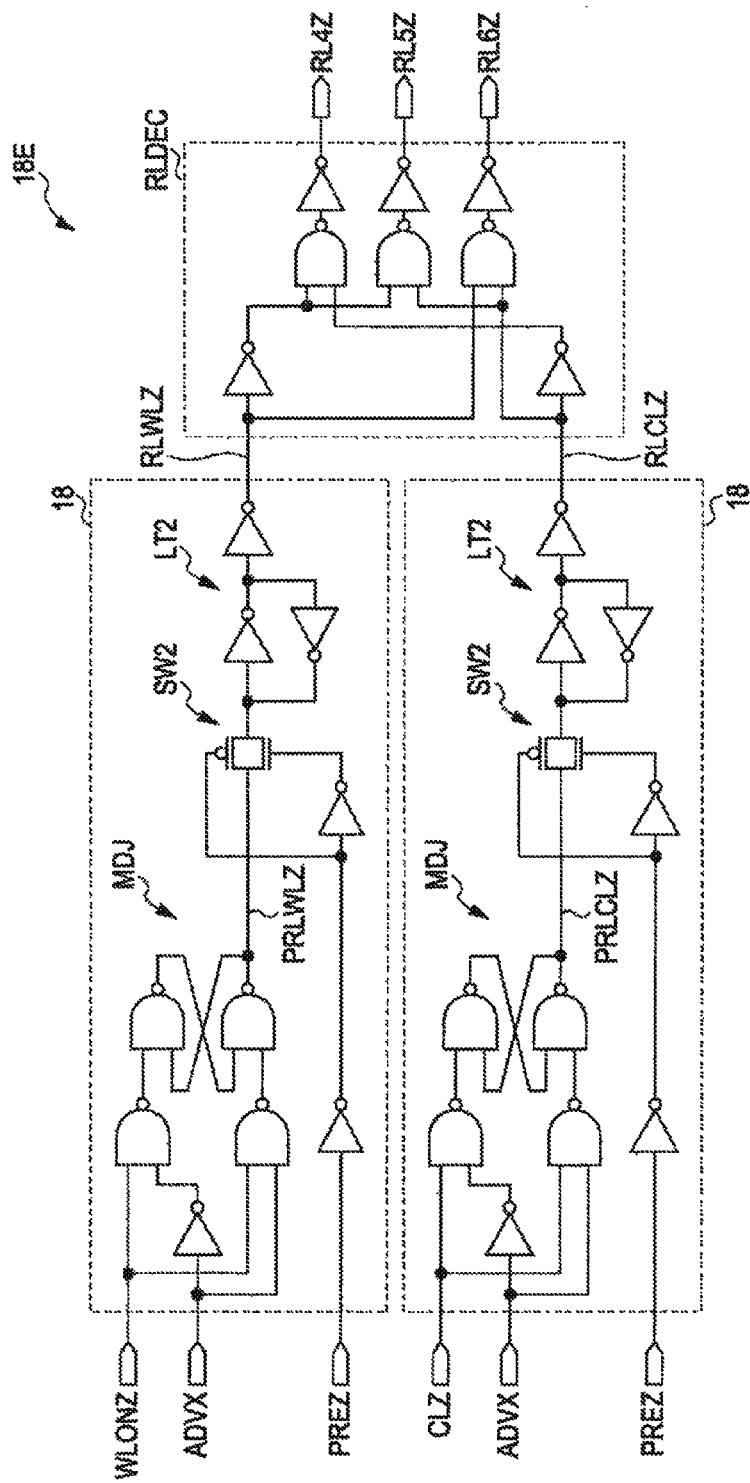
FIG. 26 illustrates an exemplary access operation control circuit.

FIG. 26 illustrates an exemplary access operation control circuit 18E. The exemplary access operation circuit may be the access operation circuit illustrated in FIG. 25. The access operation control circuit 18E includes two access operation control circuits 18 illustrated in FIG. 2 and a latency decoder RLDEC. An access operation control circuit 18 that receives a word control signal WLONZ sets a latency signal RLWLZ to a low level when an address valid signal ADVX is at a low level during a high-level period of the word control signal WLONZ. The access operation, control circuit is sets the latency signal RLWLZ to a high level when the address valid signal ADVX is at a high level during a high-level period of the word control signal WLONZ.

An access operation control circuit 18 than receives a column control signal CLZ sets a latency signal RLCLZ to a low level when an address valid signal ADVX is at a low level during a high-level period of the column control signal CLZ. The access operation control circuit 18 sets the latency signal RLCLZ to a high level when the address valid signal ADVX is at a high level curing a high-level period of the column control signal CLZ.

The latency decoder RLDEC sets one of read latency signals RP4Z, RL5Z, and RL6Z to a high level according to the logic levels of the latency signals RLWLZ and RLCLZ.

Figure 27:
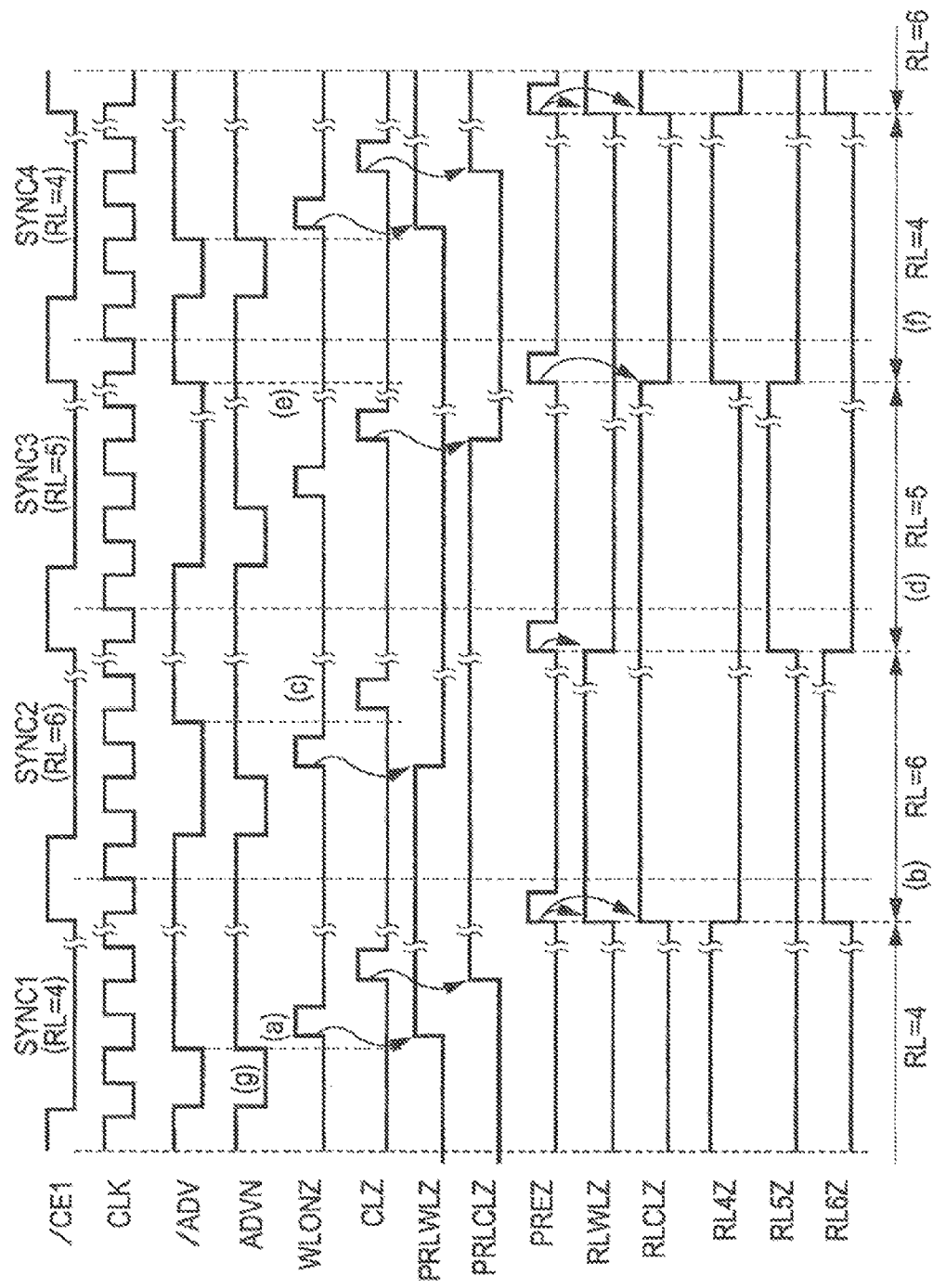
FIG. 27 illustrates an exemplary access operation to a memory.

FIG. 27 illustrates an exemplary access operation to the memory MEM illustrated in FIG. 25. Description of the same operations as those in the first to fifth embodiments is reduced or omitted. Synchronous access operations SYNC1 to SYNC4 may be sequentially performed.

When a rising edge of an address valid signal /ADV is earlier than that of a word control signal WLONZ ((a) of FIG. 27), a read latency RL is set to "6" in synchronization, with a precharge control signal PREZ ((b) of FIG. 27). When a rising edge of the address valid signal /ADV is present between rising edges of the word control signal WLONZ and a column control signal CLZ ((c) of FIG. 27), the read latency RL is set to "5" in synchronization with the precharge control signal PREZ ((d) of FIG. 27). When a rising edge of the address valid signal /ADV is later than that or the column control signal CLZ ((e) of FIG. 27), the read latency RL is set to "4" in synchronization with the precharge control signal PREZ ((f) of FIG. 27).

The pulse width of a latch address valid signal ADVL is, as with FIG. 8, substantially constant regardless of the pulse width of the address valid signal /ADV ((f) of FIG. 27). The address latch circuit 18 may securely latch an address signal AD even when the pulse width of the address valid signal /ADV is changed.

Aspects of the sixth, embodiment may have substantially the same effects as the first to fifth embodiments. In the sixth embodiment, a plurality of access modes are changed such as RL=4, 5, and 6, based on the pulse width of an address valid, signal /ADV. Therefore, access efficiency improves.

The first to sixth embodiments may be applied to pseudo SRAM type FCRAM. For example, the first to sixth embodiments may be applied to SCRAM type FCRAM or DRAM. The embodiments illustrated in FIGS. 1, 10, 15, and 25 may also be applied to SRAM or ferroelectric memories.

The first to sixth embodiments may be applied to address non-multiplex type memories MEM. For example, the first to sixth embodiments may be applied to address multiplex type semiconductor memories that sequentially receive a row address signal RAD and a column address signal CAD at a common terminal.

In the first to sixth embodiments, an access mode of a memory MEM for next and subsequent cycles may be changed based on a low-level period, for example, the pulse width of the low side, of a control signal such as an address valid signal /ADV. For example, when a positive-logic control signal is used, the access mode may be changed based on a high-level period, for example, the pulse width of the high side, of the control signal.

In the first to sixth embodiments, an access mode is determined by comparing activation timing of input signals, such as an address valid signal /ADV, an output enable signal /OE and a write enable signal /WE with activation timing of a column control signal CLZ. For example, an access mode may be determined by comparing an input signal with a word control signal WLZ or a sense amplifier control signal LEZ illustrated in FIG. 3.

In the first to sixth embodiments, the access mode is changed in synchronization, with, a precharge control signal PREZ. For example, the access mode may be changed in synchronization with deactivation timing of a bit control signal BLTZ, a word control signal WLZ, a sense amplifier control signal LEZ or the like illustrated in FIG. 3.

Aspects of exemplary embodiments in accordance with the present invention have now been described in accordance with the above advantages. It will be appreciated that these examples are merely illustrative of the invention. Many variations and modifications will be apparent to those skilled in the art.

What is claimed is:

1. A semiconductor storage device, wherein the semiconductor storage device is configured to generate a third signal for latching data based on one of a first signal and a second signal, the first and second signals being output from an address change detection signal terminal which is configured to receive a signal indicating a change in the address signal, to set a first access mode for subsequent cycles based on a first pulse width of the first signal indicating a first address change, to set a second access mode for the subsequent cycles based on a second pulse width of the second signal indicating a second address change and to perform an access operation to a core circuit based on one of the first access mode and the second access mode which are set based on the first address change and the second address change, respectively, wherein the first access mode is a synchronous operating mode, and the second access mode is an asynchronous operating mode, wherein the address change detection signal terminal is provided in addition to an address input terminal to receive an address signal.

2. The semiconductor storage device according to claim 1, wherein the first pulse width is different from the second pulse width, and a third a pulse width of the third signal is substantially constant regardless of the first pulse width and the second pulse width.

3. The semiconductor storage device according to claim 1, wherein a fourth signal is generated in synchronization with a timing signal and one of the first access mode and the second access mode is set in synchronization with an access end signal indicating an end of access to the core circuit.

4. The semiconductor storage device according to claim 1, wherein the first access mode and the second access mode are set when a column control signal is changed.

* * * * *